(12) United States Patent
Ihara et al.

(10) Patent No.: US 10,008,432 B2
(45) Date of Patent: Jun. 26, 2018

(54) SEMICONDUCTOR DEVICE, MANUFACTURING METHOD THEREOF, AND ELECTRONIC APPARATUS

(71) Applicant: Socionext Inc., Yokohama-shi, Kanagawa (JP)

(72) Inventors: Takumi Ihara, Tachikawa (JP); Nobutaka Shimizu, Machida (JP); Masamitsu Ikumo, Hachioji (JP)

(73) Assignee: SOCIONEXT INC., Yokohama (JP)

( * ) Notice: Subject to any disclaimer, the term of this patent is extended or adjusted under 35 U.S.C. 154(b) by 0 days. days.

(21) Appl. No.: 15/215,800

(22) Filed: Jul. 21, 2016

(65) Prior Publication Data
US 2017/0047266 A1     Feb. 16, 2017

(30) Foreign Application Priority Data

Aug. 11, 2015  (JP) ................................. 2015-158794

(51) Int. Cl.
*H01L 23/34* (2006.01)
*H01L 23/367* (2006.01)
(Continued)

(52) U.S. Cl.
CPC ...... *H01L 23/3675* (2013.01); *H01L 21/4882* (2013.01); *H01L 21/563* (2013.01); *H01L 23/3128* (2013.01); *H01L 23/49827* (2013.01); *H01L 23/552* (2013.01); *H01L 24/03* (2013.01); *H01L 24/09* (2013.01); *H01L 24/11* (2013.01); *H01L 24/14* (2013.01); *H01L 24/17* (2013.01); *H01L 24/83* (2013.01); *H01L 2224/0401* (2013.01); *H01L 2224/14051* (2013.01); *H01L 2224/73204* (2013.01); *H01L 2224/73253* (2013.01); *H01L 2924/01013* (2013.01);
(Continued)

(58) Field of Classification Search
CPC ........... H01L 23/3675; H01L 23/49827; H01L 23/3128; H01L 21/4882; H01L 21/563; H01L 24/17; H01L 23/552; H01L 24/11; H01L 24/09; H01L 24/03; H01L 24/14
USPC ........................................................ 257/706
See application file for complete search history.

(56) References Cited

U.S. PATENT DOCUMENTS 6,285,554 B1  9/2001  Westberg
6,433,412 B2* 8/2002  Ando .................... H01L 21/563
                                                    257/676

(Continued)

FOREIGN PATENT DOCUMENTS

JP    11-121660 A    4/1999
JP    2000-150576 A  5/2000
(Continued)

*Primary Examiner* — Luan C Thai
(74) *Attorney, Agent, or Firm* — Westerman, Hattori, Daniels & Adrian, LLP

(57) ABSTRACT

A semiconductor device includes a substrate and a semiconductor element mounted on the top surface of the substrate. On the top surface of the substrate, one or more pads are disposed outside the mounted semiconductor element when seen in a plan view. Then, a protrusion is disposed on each of the pads. A heat sink is disposed above the semiconductor element and the protrusions, and then bonded to the substrate by an adhesive provided between the heat sink and the substrate. The adhesive is provided in such a manner as to be in contact with the protrusions on the substrate.

17 Claims, 19 Drawing Sheets

(51) Int. Cl.
  *H01L 23/00*    (2006.01)
  *H01L 23/498*   (2006.01)
  *H01L 21/48*    (2006.01)
  *H01L 21/56*    (2006.01)
  *H01L 23/552*   (2006.01)
  *H01L 23/31*    (2006.01)

(52) U.S. Cl.
  CPC ............... *H01L 2924/01028* (2013.01); *H01L 2924/01029* (2013.01); *H01L 2924/01079* (2013.01); *H01L 2924/15192* (2013.01); *H01L 2924/15311* (2013.01); *H01L 2924/15331* (2013.01)

(56) References Cited

U.S. PATENT DOCUMENTS

| | | | | |
|---|---|---|---|---|
| 7,186,928 B2 | 3/2007 | Kikuchi et al. | | |
| 7,777,351 B1* | 8/2010 | Berry | ................ | H01L 23/3128 257/778 |
| 7,968,999 B2* | 6/2011 | Celik | ................ | H01L 23/10 257/707 |
| 8,018,034 B2* | 9/2011 | Chi | ................ | H01L 23/29 257/660 |
| 8,482,134 B1* | 7/2013 | Darveaux | ................ | H01L 24/16 257/686 |
| 8,564,121 B2* | 10/2013 | Ihara | ................ | H01L 23/552 257/675 |
| 8,940,584 B2* | 1/2015 | Kim | ................ | H01L 23/552 438/107 |
| 9,029,989 B2* | 5/2015 | Park | ................ | H01L 23/373 257/629 |
| 2014/0124906 A1* | 5/2014 | Park | ................ | H01L 21/565 257/659 |

FOREIGN PATENT DOCUMENTS

JP       2002-539631 A      11/2002
JP       2004-71658 A       3/2004

\* cited by examiner

SEMICONDUCTOR DEVICE, MANUFACTURING METHOD THEREOF, AND ELECTRONIC APPARATUS

CROSS-REFERENCE TO RELATED APPLICATION

This application is based upon and claims the benefit of priority of the prior Japanese Patent Application No. 2015-158794, filed on Aug. 11, 2015, the entire contents of which are incorporated herein by reference.

FIELD

The embodiments discussed herein are related to a semiconductor device, a manufacturing method thereof, and an electronic apparatus.

BACKGROUND

There have been known techniques for providing a heat sink above a semiconductor element mounted on a substrate and securing a part of the heat sink to the substrate. As for securing a part of the heat sink to the substrate, a technique has been proposed, for example, which uses a thermally conductive adhesive to secure the part of the heat sink to the substrate.

Japanese Laid-open Patent Publication No. 11-121660

As for a semiconductor device including a semiconductor element mounted on a substrate, it is sometimes the case that the substrate undergoes deformation, such as expansion, contraction, and warpage, due to thermal stress caused by heat associated with the assembly of an electronic apparatus using the semiconductor device and/or heat associated with the actual use of the semiconductor device or electronic apparatus. In the case of a semiconductor device employing the technique for securing, by an adhesive, a part of a heat sink to a substrate on which a semiconductor element is mounted, thermal stress described above and resulting deformation in the substrate may cause separation of the adhesive from the substrate.

SUMMARY

According to an aspect, there is provided a semiconductor device including a substrate; a semiconductor element mounted on a first surface of the substrate; a first pad disposed on the first surface and outside of the semiconductor element in a plan view; a first protrusion disposed on the first pad; a heat sink disposed above the semiconductor element and the first protrusion; and a first adhesive disposed between the first surface and the heat sink to bond the first protrusion and the heat sink.

The aspect and advantages of the invention may be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 19:
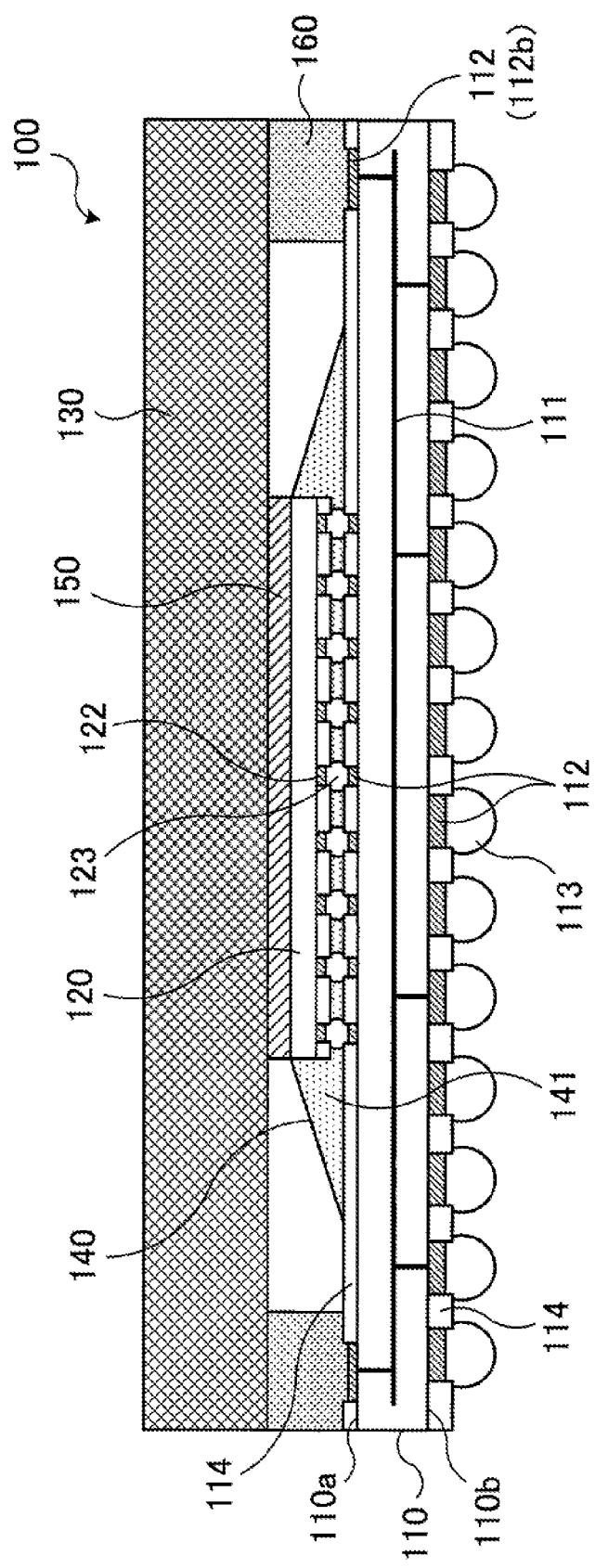
FIG. 19 illustrates an example of a configuration of a semiconductor device according to one form.

First, a semiconductor device according to one form is described. An example of a configuration of the semiconductor device according to the form is represented in FIG. 19. Specifically, FIG. 19 is a schematic cross section of a main part of the semiconductor device according to the form. A semiconductor device 100 of FIG. 19 includes a substrate 11C, a semiconductor element 120, a heat sink 130, an underfill resin 140, a thermally conducting material 150, and an adhesive 160.

The substrate 110 includes various types of wiring systems, such as signal wiring, power supply wiring, and ground wiring. In FIG. 19, ground wiring 111 is depicted as an example of the wiring systems in the substrate 110. On a top surface 110a of the substrate 110, a plurality of pads 112 electrically connected to the wiring systems (such as the ground wiring 111) are provided. The pads 112 on the top surface 110a are disposed, for example, in a region where the semiconductor element 120 is to be mounted, as well as at edges of the top surface 110a of the substrate 110. The pads 112 (112b) at the edges of the top surface 110a are electrically connected to the ground wiring 111. The pads 112 may be provided on a rear surface 110b of the substrate 110 in a similar fashion. Solder balls are connected, as terminals 113, to the pads 112 on the rear surface 110b. In addition, a protective overcoat 114 may be provided on each of the top surface 110a and the rear surface 110b of the substrate 110 in such a manner that at least part of each of the pads 112 is exposed.

The semiconductor element 120 is mounted on the top surface 110a of the above-described substrate 110. The semiconductor element 120 includes pads 122 disposed at positions corresponding to the pads 112 in the mounting region on the substrate 110. The semiconductor element 120 and the substrate 110 are mechanically and electrically connected to each other when their pads 122 and 112 are joined together using solder balls (bumps) 123.

Between the substrate 110 and the semiconductor element 120 joined thereto via the bumps 123, the underfill resin 140 is provided which functions as an adhesive to bond the substrate 110 and the semiconductor element 120 together. In addition to the gap between the substrate 110 and the semiconductor element 120 in the mounting region, the underfill resin 140 also extends outward from the mounting region, specifically from the lateral side of the semiconductor element 120, over the top surface 110a. The part of the underfill resin 140 extending from the lateral side of the semiconductor element 120 outward onto the top surface 110a is hereinafter referred to as a fillet 141. The underfill resin 140 including the fillet 141 described above improves the strength of the connection between the semiconductor element 120 and the substrate 110.

The heat sink 130 is disposed above the semiconductor element 120 mounted on the substrate 110. The heat sink 130 is made, for example, of a metallic material. FIG. 19 illustrates, as an example, the heat sink 130 in the shape of a plate; however, the semiconductor device 100 may be provided with the heat sink 130 formed in a box-like structure, overlying the top and lateral sides of the semiconductor element 120 mounted on the substrate 110. The heat sink 130 is bonded, using the thermally conducting material 150, to the upper surface of the semiconductor element 120 mounted on the top surface 110a of the substrate 110. The thermally conducting material 150 is made of a thermal interface material (TIM), solder, a conductive paste or the like. The heat sink 130 is fixed in place with a central portion thereof bonded to the upper surface of the semiconductor element 120 as well as edges thereof bonded to the edges of the substrate 110 by means of the adhesive 160.

In the semiconductor device 100 including the above-described structure, the semiconductor element 120 produces heat during its operation. The heat produced by the semiconductor element 120 in operation is, for example, transferred to the heat sink 130 via the thermally conducting material 150 and then released from the heat sink 130 to the outside of the semiconductor device 100. This reduces overheating and resulting damage of the semiconductor element 120. Note that the heat sink 130 is not the only heat dissipation path for the semiconductor device 100. For example, heat is dissipated directly to the outside from the semiconductor element 120, and also transferred from the semiconductor element 120 to the substrate 110 and then dissipated from the substrate 110 to the outside.

In the semiconductor device 100, the use of a thermally conductive adhesive, such as a silicone-based adhesive, as the adhesive 160 to bond the heat sink 130 and the substrate 110 provides relatively a high level of heat transfer between the heat sink 130 and the substrate 110. In addition, an electrically conductive adhesive may be used as the adhesive 160 so that the heat sink 130 is electrically connected via the electrically conductive adhesive to the grounded pads 112b at the edges of the substrate 110. This provides the heat sink 130 with a function of blocking incidence of electromagnetic waves from outside or a function of electromagnetic shielding to reduce emission of electromagnetic waves from the inside of the semiconductor device 100.

In addition to during its operation as described above, the semiconductor device 100 may also be exposed to heat when it is connected to a different electronic part, such as a circuit board, during the assembly to mount the semiconductor device 100 on the different electronic part with the use of the terminals 113. Due to the heat during the actual use and assembly as well as mismatch in coefficients of thermal expansion among various materials used therein, thermal stress may be induced in the semiconductor device 100. Then the thermal stress may cause deformation in the substrate 110, such as expansion, contraction, warpage, and undulation. Such deformation in the substrate 110 may separate the adhesive 160 from the edges of the substrate 110. The separation of the adhesive 160 from the substrate 110 may increase the thermal resistance between the heat sink 130 and the substrate 110, contributing to decreased heat dissipation of the semiconductor device 100.

In addition, in the case of the semiconductor device 100 with the substrate 110 designed to have a small planar size in order to increase the occupancy of the semiconductor element 120 including the fillet 141, the bonding area for the adhesive 160 to bond the heat sink 130 to the edges of the substrate 110 is reduced. The semiconductor device 100 in such a configuration is subject to separation of the adhesive 160 from the substrate 110 because the adhesive 160 bonds the heat sink 130 to the substrate 110 at the edges of the substrate 110 where thermal stress is most likely to occur and the boding area of the adhesive 160 is reduced.

In the case of the semiconductor device 100 where the heat sink 130 is electrically connected, using the electrically conductive adhesive 160, to the grounded pads 112b at the edges of the substrate 110, a reduction in the bonding area of the adhesive 160 as described above leads to a decrease in the disposition area for the pads 112b (i.e., a decrease in the number of the pads 112b disposed). Because electrically conductive adhesives tend to exhibit lower bonding strength compared to, for example, silicone-based adhesives primarily designed for heat transfer, separation of the electrically conductive adhesive 160 from the substrate 110 is relatively likely to take place. The separation causes disconnection or the like between the heat sink 130 and the grounded pads 112b together with the ground wiring 111 connected thereto. The disconnection then increases the electrical resistance (impedance) between the heat sink 130 and the ground wiring 111. Such increased impedance is more likely to occur with a reduced number of pads 112b disposed at the edges of the substrate 110. The increased impedance between the heat sink 130 and the ground wiring 111 may cause a problem in which a current induced by excited noise within the heat sink 130 has nowhere to go and the heat sink 130 expected to function as an electromagnetic shield fails to fulfill the function and radiates electromagnetic waves.

Figure 1:
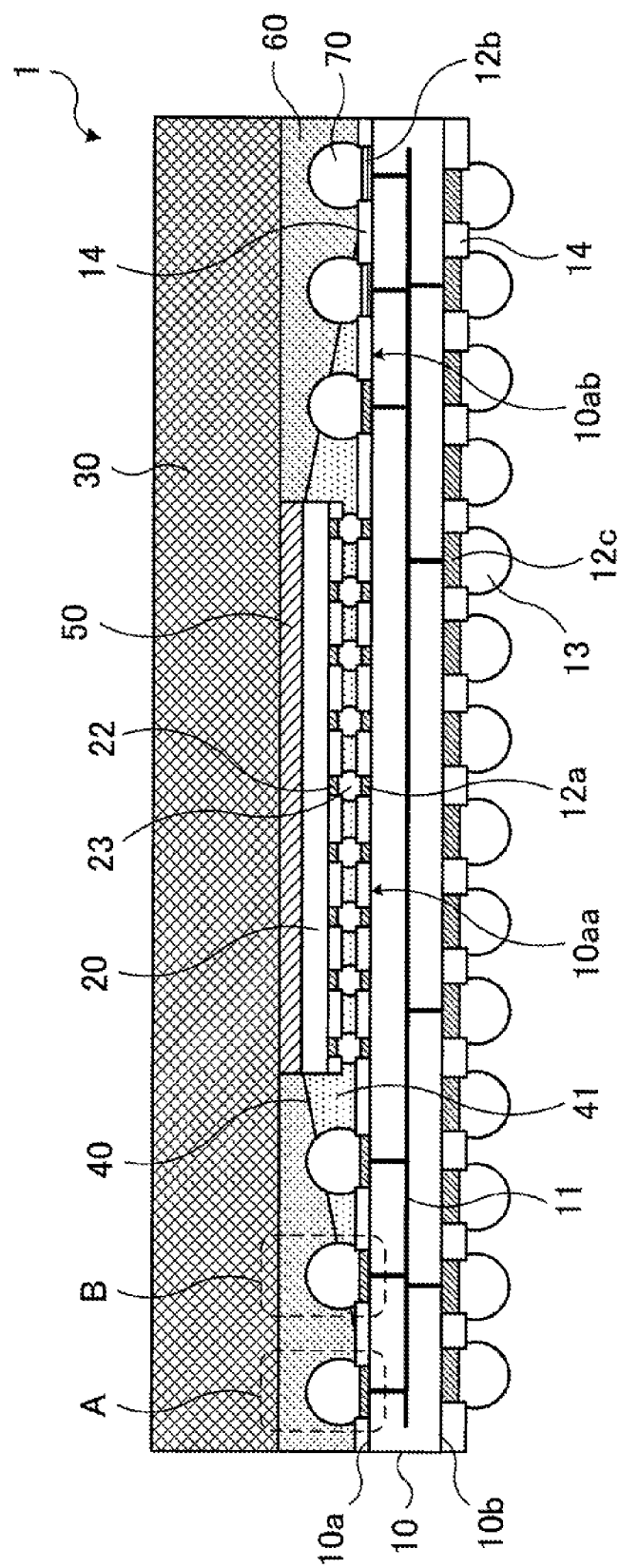
FIG. 1 is a first diagram illustrating an example of a configuration of a semiconductor device according to a first embodiment.
Figure 2:
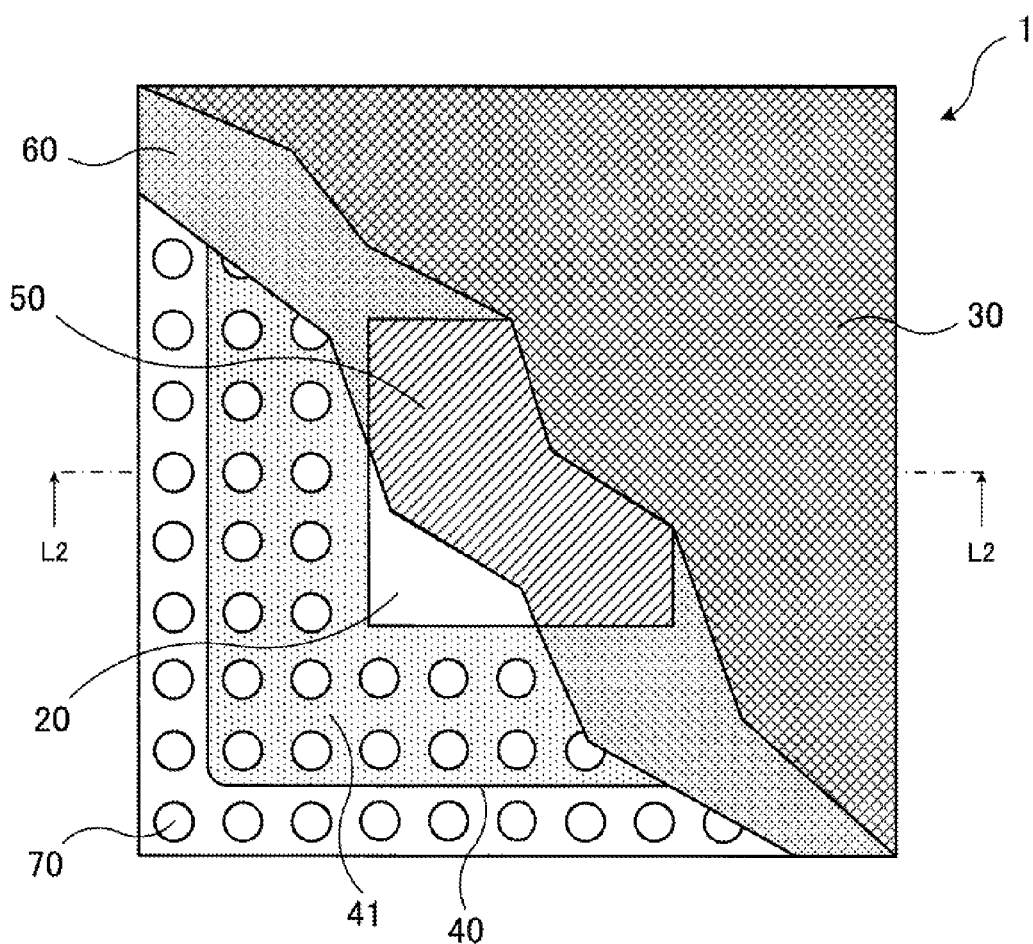
FIG. 2 is a second diagram illustrating the example of the configuration of the semiconductor device according to the first embodiment.

In view of the above-described problems, the following embodiments adopt configurations described below so as to reduce, in a semiconductor device where a substrate with a semiconductor element mounted thereon and a heat sink disposed above the semiconductor element are bounded together by an adhesive, separation of the adhesive from the substrate. Several embodiments will be described below (a) First Embodiment FIGS. 1 and 2 illustrate an example of a configuration of a semiconductor device according to a first embodiment. FIG. 1 is a schematic cross section of a main part of the semiconductor device exemplified in the first embodiment. FIG. 2 is a schematic plan view of a main part of the semiconductor device exemplified in the first embodiment. As for each of a heat sink, a thermally conducting material, and an adhesive in FIG. 2, only a part thereof is depicted to reveal the internal arrangement. FIG. 1 is a schematic cross-sectional view of FIG. 2 along line L2-L2. A semiconductor device 1 of FIGS. 1 and 2 includes a substrate 10, a semiconductor element 20, a heat sink 30, an underfill resin 40, a thermally conducting material 50, an adhesive 60, and protrusions 70.

The substrate 10 is a circuit board such as a printed circuit board. The substrate 10 includes various types of wiring systems, such as signal wiring, power supply wiring, and ground wiring. In FIG. 1, ground wiring 11 is depicted as an example of the wiring systems in the substrate 10. On a top surface 10a of the substrate 10, a plurality of pads electrically connected to a wiring system (e.g. the ground wiring 11) are provided. As illustrated in FIGS. 1 and 2, the grouped pads provided on the top surface 10a of the substrate 10 are divided into a group of pads 12a arranged in a region 10aa in which the semiconductor element 20 is disposed and a group of pads 12b arranged in a region 10ab located outside of the region 10aa. As illustrated in FIG. 1, the grouped pads 12b in the region 10ab are electrically connected to the ground wiring 11. A plurality of pads may be provided also on a rear surface 10b of the substrate 10 in a similar fashion. As illustrated in FIG. 1, a solder ball is connected as a terminal 13 on each of grouped pads 12c provided on the rear surface 10b of the substrate 10. In addition, a protective overcoat 14 such as a solder resist is provided on each of the top surface 10a and the rear surface 10b of the substrate 10 in such a manner that at least part of each of the pads 12a, 12b, and 12c are exposed, as depicted in FIGS. 1 and 2.

On the top surface 10a of the substrate 10 formed in the above-described manner, the semiconductor element 20 and the protrusions 70 are mounted, as depicted in FIGS. 1 and 2. The semiconductor element 20 is, for example, a semiconductor chip such as a large scale integration (LSI) or a semiconductor package including such a semiconductor chip and a package substrate on which the semiconductor chip is mounted. The semiconductor element 20 includes, as illustrated in FIG. 1, a group of pads 22 disposed at positions corresponding to the group of pads 12a in the region 10aa of the substrate 10 on which the semiconductor element 20 is mounted. The semiconductor element 20 and the substrate 10 are mechanically and electrically connected to each other when their grouped pads 22 and 12a are individually bonded together using solder balls (bumps) 23.

On the top surface 10a of the substrate 10, the group of protrusions 70 are mounted together with the semiconductor element 20, as illustrated in FIGS. 1 and 2. The grouped protrusions 70 are individually disposed on the grouped pads 12b in the region 10ab located outside of the region 10aa where the semiconductor element 20 is mounted. The grouped protrusions 70 are made, for example, of a material with thermal and electrical conductivity, such as solder. Alternatively, the grouped protrusions 70 may be made of a different electrically conductive material, such as copper (Cu), aluminum (Al), nickel (Ni), and gold (Au). FIGS. 1 and 2 depict, as an example, the grouped solder protrusions 70 each formed in the shape of a ball.

Between the substrate 10 and the semiconductor element 20 joined together via the bumps 23, the underfill resin 40 is provided to bond the substrate 10 and the semiconductor element 20 together, as illustrated in FIGS. 1 and 2. The underfill resin 40 includes a fillet 41 extending from the lateral side of the semiconductor element 20 outward onto the region 10ab. FIGS. 1 and 2 depict, as an example, the fillet 41 extending but not reaching the edges of the substrate 10. The underfill resin 40 with the fillet 41 having this configuration improves the strength of the connection between the semiconductor element 20 and the substrate 10. As for the grouped protrusions 70 disposed on the region 10ab of the substrate 10, at least part of each of the protrusions 70 is exposed from the fillet 41 of the underfill resin 40, extending over the region 10ab. In order to expose at least part of each of the protrusions 70 from the fillet 41, either the height of each of the protrusions 70 on the substrate 10 or the height (thickness) or breadth of the fillet 41 over the substrate 10 is adjusted.

The heat sink 30 is disposed, as illustrated in FIGS. 1 and 2, above the semiconductor element 20 and the protrusions 70 mounted on the substrate 10 in the above-described manner. The heat sink 30 is made of a material with thermal and electrical conductivity, for example, a metal such as Cu and Al. The heat sink 30 is bonded, using the thermally conducting material 50, to the upper surface of the semiconductor element 20 mounted on the top surface 10a of the substrate 10, as illustrated in FIGS. 1 and 2. The thermally conducting material 50 is made of a material with thermal conductivity, such as a TIM, solder, and a conductive paste. The heat sink 30 is thermally connected to the semiconductor element 20 via the thermally conducting material 50.

The adhesive 60 is provided between the heat sink 30 and the substrate 10, as illustrated in FIGS. 1 and 2. For example, a conductive adhesive is used as the adhesive 60. The adhesive 60 fills a gap between the substrate 10 with the top surface 10a, on which the semiconductor element 20, the grouped protrusions 70, and the underfill resin 40 are mounted, and the heat sink 30 disposed on the semiconductor element 20 via the thermally conducting material 50, as illustrated in FIG. 1. The adhesive 60 is, as illustrated in FIG. 1, in contact with the part of each of the protrusions 70, exposed from the fillet 41 of the underfill resin 40. The heat sink 30 and the substrate 10 are electrically connected to each other through the electrically conductive adhesive 60 and each of the protrusions 70, at least part of which is in contact with the adhesive 60.

Figure 3:
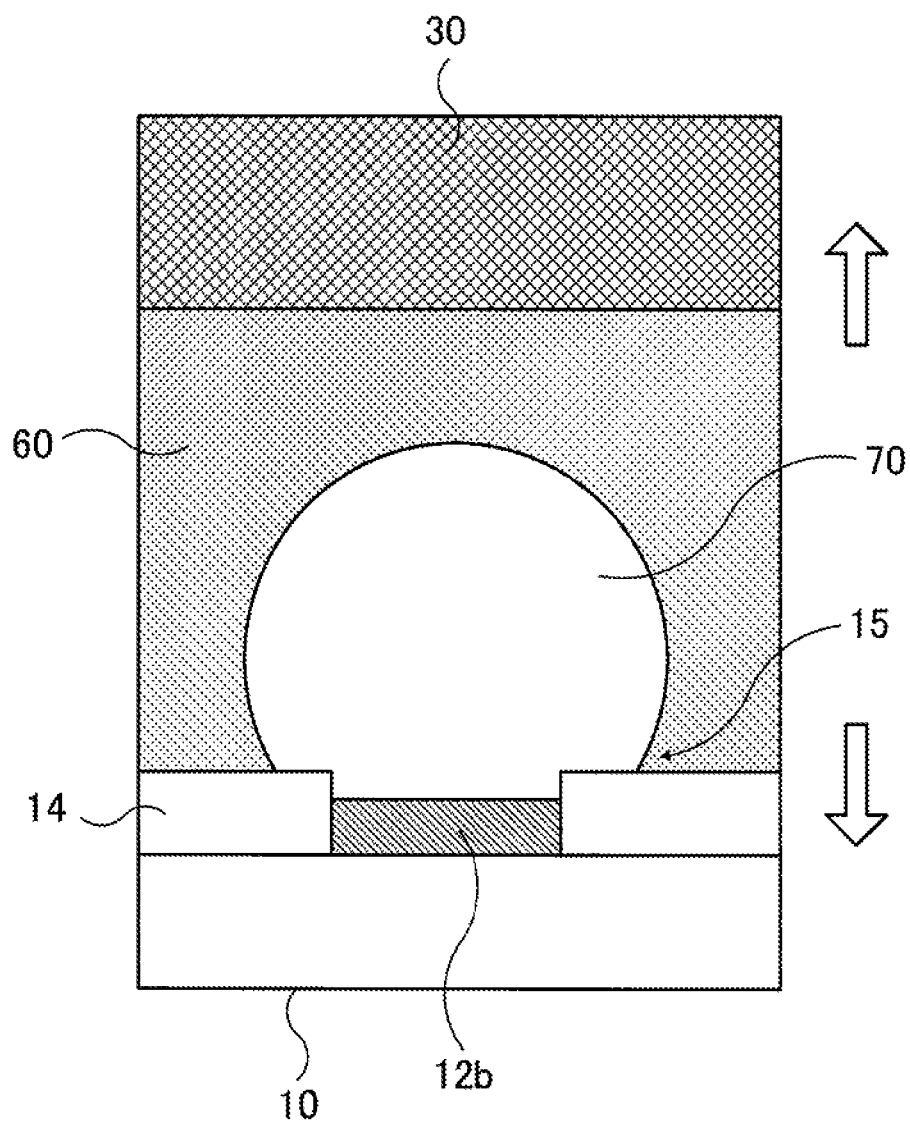
FIG. 3 is a first explanatory diagram illustrating an effect of reducing separation of an adhesive from a substrate of the semiconductor device according to the first embodiment.
Figure 4:
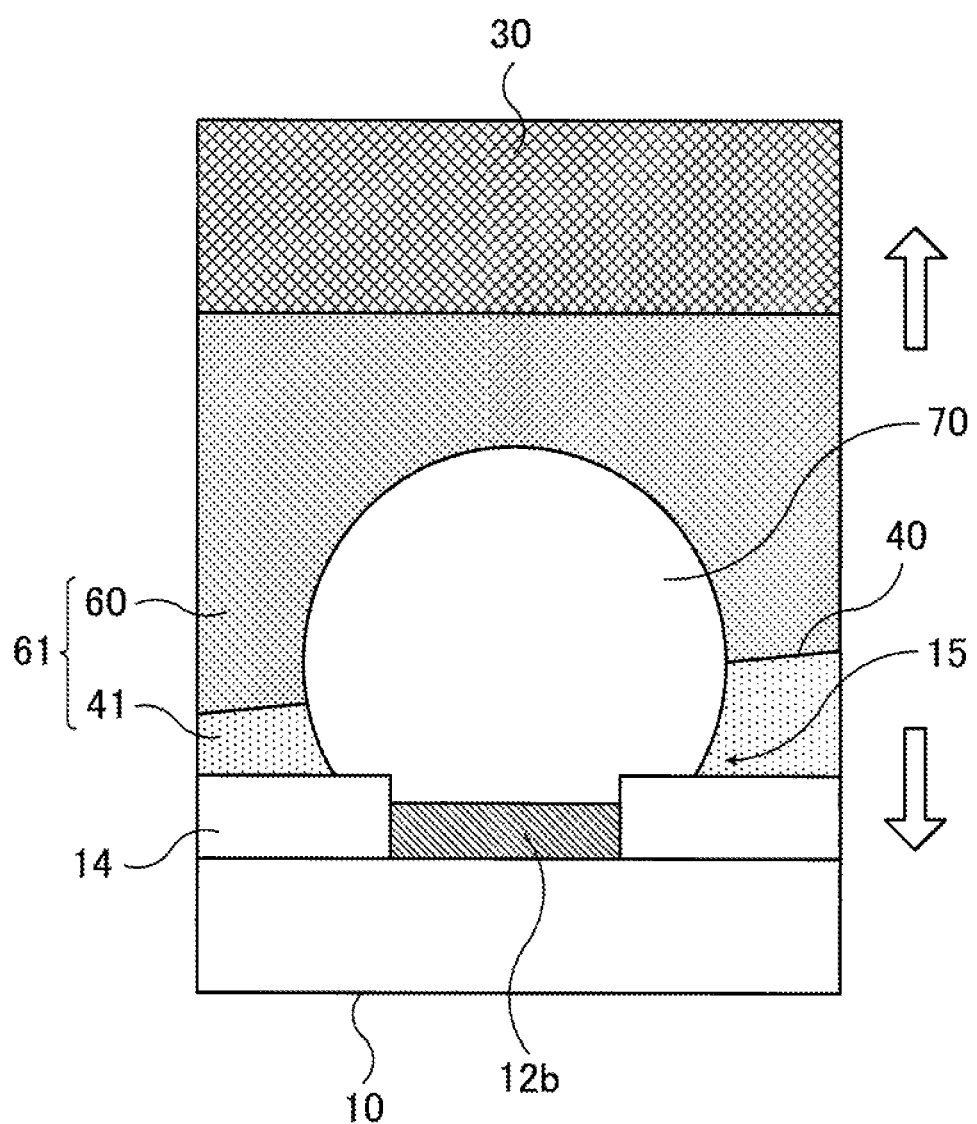
FIG. 4 is a second explanatory diagram illustrating the effect of reducing separation of the adhesive from the substrate of the semiconductor device according to the first embodiment.

According to the semiconductor device 1 with the above-described configuration, the provision of the grouped protrusions 70 on the substrate 10 effectively reduces separation of the adhesive 60 from the substrate 10 even when the substrate 10 is subjected to thermal stress caused by heat associated with the assembly and actual use of the semiconductor device 1. FIGS. 3 and 4 are explanatory diagrams illustrating the effect of reducing separation of the adhesive from the substrate in the semiconductor device according to the first embodiment.

FIG. 3 is an enlarged schematic view of section A in FIG. 1. In the semiconductor device 1, as illustrated in FIG. 3, the protrusion 70 is provided on the pad 12b exposed from the protective overcoat 14 on the top surface 10a of the substrate 10. The heat sink 30 is disposed, on the top surface 10a side of the substrate 10, to oppose the substrate 10. Then, the adhesive 60 is placed between the substrate 10 and the heat sink 30 opposing each other. Thus, according to the semiconductor device 1, the protrusion 70 is provided on the pad 12b on the substrate 10 opposing the heat sink 30 across the adhesive 60. Herewith, the surface of the substrate 10, opposing the heat sink 30 has increased surface area compared to the case where the protrusion 70 is not provided. This increases the area of contact between the substrate 10 with the protrusion 70 provided thereon and the adhesive 60, improving the strength of bonding between them. The protrusion 70 on the substrate 10 serves as an anchor when enclosed by the adhesive 60. Even when forces to pull the substrate 10 and the heat sink 30 provided across the adhesive 60 away from each other (indicated by the outlined arrows in FIG. 3) are generated by thermal stress, the anchor effect of the protrusion 70 reduces separation of the adhesive 60 from the substrate 10.

In the semiconductor device 1, a solder bump in the shape of, for example, a ball is provided as the protrusion 70 on the pad 12b. When the protrusion 70 has a ball-like shape, the diameter of the protrusion 70 on the cross-section along a plane parallel to the top surface 10a of the substrate 10 gradually increases up to a point and then starts to gradually decrease as the plane shifts from the pad 12b toward the heat sink 30. That is, the substrate 10 with the ball-shaped protrusion 70 disposed on the pad 12b has a constricted part 15, within the protrusion 70, in a lower section close to the pad 12b. Some of the adhesive 60 comes into contact with the constricted part 15 of the substrate 10 and fills the gap around the constricted part 15 to thereby hold the protrusion 70. As a result, even when forces to pull the substrate 10 and the heat sink 30 provided across the adhesive 60 away from each other (indicated by the outlined arrows in FIG. 3) are generated by thermal stress, the holding power of the adhesive 60 reduces separation of the adhesive 60 from the substrate 10.

FIG. 4 is an enlarged schematic view of section B in FIG. 1. In the semiconductor device 1, some of the protrusions 70 are disposed in a region where the fillet 41 of the underfill resin 40 is formed. As for each of these protrusions 70, a part thereof is exposed from the fillet 41 and the remaining part is covered by the fillet 41, as illustrated in FIG. 4. That is, the fillet 41 of the underfill resin 40 comes into contact with the constricted part 15, within the protrusion 70, in the lower section close to the pad 12b and fills the gap around the constricted part 15. The adhesive 60 is disposed on the fillet 41 of the underfill resin 40, some of which fills the gap around the constricted part 15 of the substrate 10, in such a manner as to have contact with the part of the protrusion 70 exposed from the fillet 41. Both the adhesive 60 and the fillet 41 (i.e., the underfill resin 40) are made of resin materials and therefore exhibit good adhesion to each other. As a result, the protrusion 70 successfully serves as an anchor inside a laminated body 61 composed of the adhesive 60 and the fillet 41 having good adhesion to the adhesive 60. In turn, the protrusion 70 is held by the laminated body 61. Therefore, even when forces to pull the substrate 10 and the heat sink 30 away from each other (indicated by the outlined arrows in FIG. 4) are generated by thermal stress, the anchor effect or the anchor effect and the holding power reduce separation of the fillet 41 and the adhesive 60 (the laminated body 61) from the substrate 10.

The provision of the protrusion 70 generates the anchor effect or the anchor effect and the holding power described above, which effectively reduces separation of the adhesive 60 from the substrate 10. Providing such a protrusion 70 in plurality yielding the anchor effect or the anchor effect and the holding power on the substrate 10 results in increased adhesion sites of the adhesive 60, thus reducing separation of the adhesive 60 from the substrate 10 further effectively.

In addition, when the heat sink 30, the adhesive 60, and the grouped protrusions 70 of the semiconductor device 1 are made of electrically conductive materials, as described above, the heat sink 30 acts as an electromagnetic shield. In the semiconductor device 1 using the heat sink 30 as an electromagnetic shield, the following advantages may be achieved by disposing, for example, at least some (one, or two or more) of the grouped protrusions 70 in a region near the semiconductor element 20, where the fillet 41 of the underfill resin 40 is formed. In this case, the pads 12b used to electrically connect the heat sink 30 to the substrate 10 (the ground wiring 11) are also disposed in the region with the fillet 41 formed, near the semiconductor element 20. The disposition location of the pads 12b does not need to be outside of where the fillet 41 is formed, which allows greater flexibility in wiring design of the substrate 10. Further, at least some of the grouped protrusions 70 are located near the central portion (the region 10aa) of the substrate 10, comparatively less subject to thermal stress caused by heat associated with the assembly and actual use of the semiconductor device 1. Therefore, electrical connection to the adhesive 60 is secured by these protrusions 70 located near the central portion of the substrate 10, thereby reducing the risk of the electrical connection path being cut due to separation of the adhesive 60.

In addition, in the semiconductor device 1 using the heat sink 30 as an electromagnetic shield, the following advantages may be achieved by providing a plurality of protrusions 70. That is, because the heat sink 30 is electrically connected to the grouped protrusions 70 via the adhesive 60, the grouped protrusions 70 result in providing an increased number of electrical connection paths between the heat sink 30 and the substrate 10 (the ground wiring 11). The increased number of electrical connection paths between the heat sink 30 and the substrate 10 contribute to, between the heat sink 30 and the substrate 10, a reduction in the risk of the electrical connection being cut and a reduction in the impedance.

Thus, according to the semiconductor device 1, the provision of the grouped protrusions 70 reduces separation of the adhesive 60 from the substrate 10, and further reduces, between the heat sink 30 and the substrate 10, the impedance and the risk of the electrical connection being cut. As a result, the semiconductor device 1 achieves high electromagnetic shielding performance.

Note that the semiconductor device 1 may have a configuration in which the heat sink 30 and the substrate 10 are not electrically connected to each other (i.e., the heat sink 30 is not used as an electromagnetic shield). In such a case, an insulating adhesive is used as the adhesive 60. In the case of using the insulating adhesive 60, the protrusions 70, or the protrusions 70 and the pads 12b on which the protrusions 70 are disposed, need not necessarily be electrically conductive. In addition, the protrusions 70 need not necessarily be grounded (i.e., need not necessarily be electrically connected to the ground wiring 11). Further, the underfill resin 40 need not necessarily be provided.

The above example illustrates the case where a plurality of protrusions 70 are provided on the substrate 10; however, the above-described effects, that is, the effect of reducing separation of the adhesive 60 from the substrate 10 and the effect of obtaining electromagnetic shielding performance, are achieved by providing at least one protrusion 70 on the substrate 10.

With reference to FIGS. 5A and 5B to 11A and 11B, a manufacturing method of a semiconductor device is described next, taking the semiconductor device 1 illustrated in FIGS. 1 and 2 as an example. FIGS. 5A and 5B to 11A and 11B are explanatory diagrams illustrating the manufacturing method of the semiconductor device according to the first embodiment. Each manufacturing step is described next with reference to FIGS. 5A and 5B to 11A and 11B.

Figure 5A:
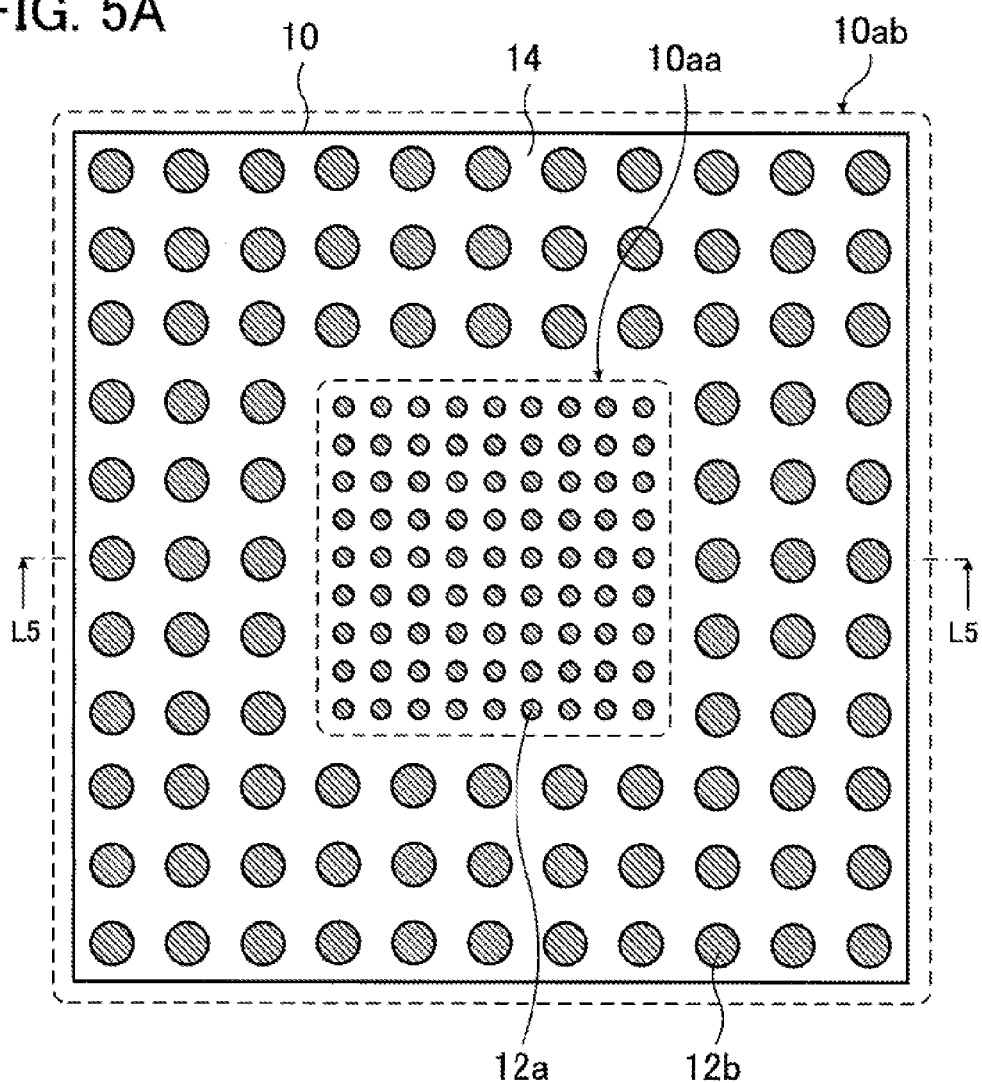
FIGS. 5A and 5B illustrate an example of a substrate preparation step according to the first embodiment.
Figure 5B:
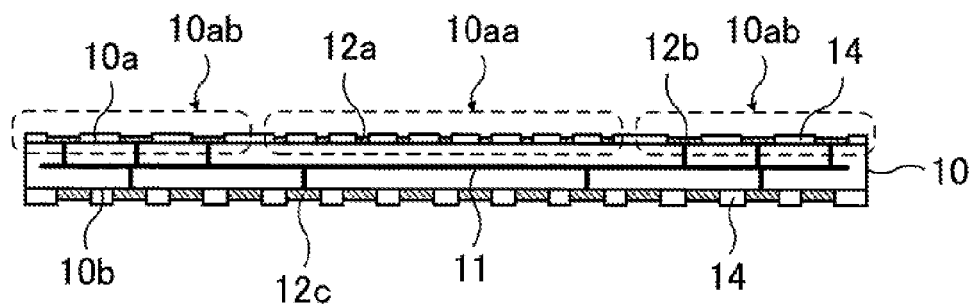

FIGS. 5A and 5E illustrate an example of a substrate preparation step according to the first embodiment. FIG. 5A is a schematic plan view of a main part associated with the substrate preparation step. FIG. 5B is a schematic cross-sectional view of the main part associated with the substrate preparation step, specifically a schematic cross-sectional view of FIG. 5A along line L5-L5. In the manufacture of the semiconductor device 1, the substrate 10 illustrated in FIGS. 5A and 5B is prepared first. The substrate 10 includes wiring systems installed inside the substrate 10 (only the ground wiring 11 is illustrated in FIG. 5B), the grouped pads 12a and 12b disposed on the top surface 10a, the grouped pads 12c disposed on the rear surface 10b, and the protective overcoats 14 individually provided on the top and rear surfaces 10a and 10b. At least part of each of the pads 12a, 12b, and 12c are exposed from the corresponding protective overcoat 14.

The grouped pads 12a in the central region 10aa of the substrate 10 are individually disposed at positions corresponding to a group of terminals (the pads 22 or bumps 23) of the semiconductor element 20 to be mounted thereon as described later. The grouped pads 12b in the region 10ab located on the outer side of the region 10aa are disposed based on arrangement of the grouped protrusions 70 to be installed as described later. The grouped pads 12b may be arranged in a matrix uniformly such that the pitch between any two adjacent pads 12b in a planer view is constant over the entire matrix, or the arrangement of the grouped pad 12b may include some grouped pads 12b having variable pitches. The grouped pads 12c on the rear surface 10b are disposed at positions corresponding to a group of terminals of an electronic part (such as a circuit board) on which the semiconductor device 1 after production is to be mounted.

The substrate 10 is, for example, a printed circuit board. There are no restrictions in the number of layers in the substrate 10, which may thus be a multi- or single-layer printed circuit board. The substrate 10 may be a build-up substrate formed by laminating wiring layers on a core substrate using prepreg or the like.

Figure 6A:
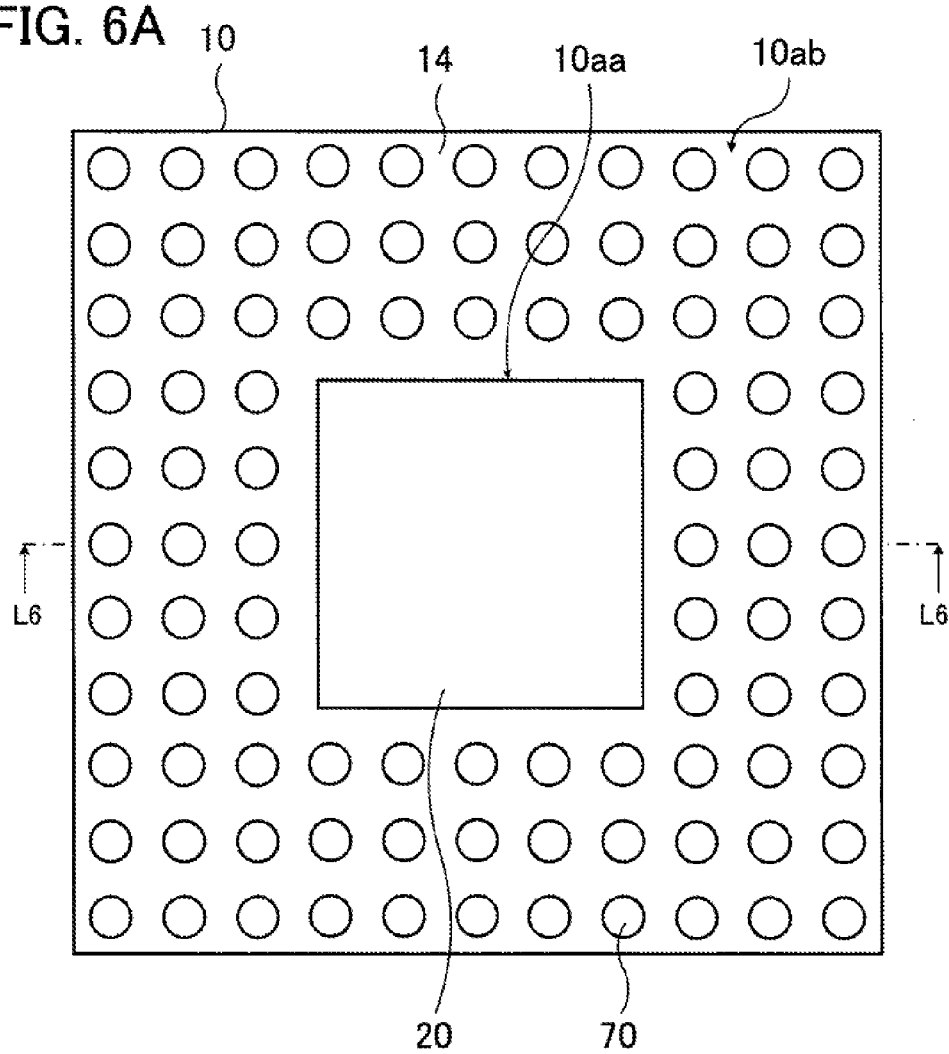
FIGS. 6A and 6B illustrate an example of a step of disposing a semiconductor element and protrusions according to the first embodiment.
Figure 6B:
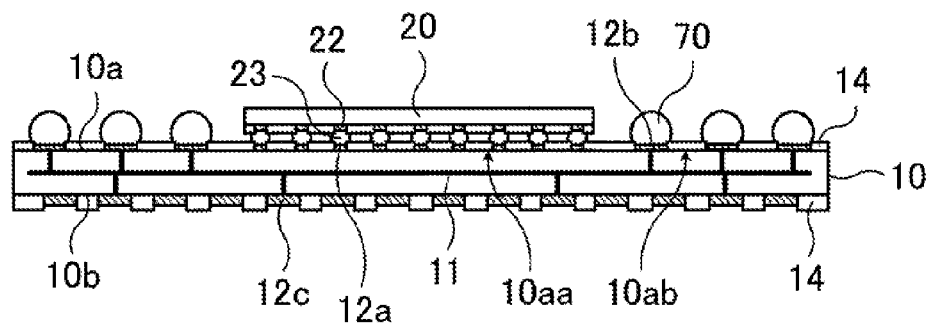

FIGS. 6A and 6B illustrate an example of a step of disposing the semiconductor element and the protrusions according to the first embodiment. FIG. 6A is a schematic plan view of a main part associated with the disposing step. FIG. 6B is a schematic cross-sectional view of the main part associated with the disposing step, specifically a schematic cross-sectional view of FIG. 6A along line L6-L6. The semiconductor element 20 and the grouped protrusions 70 are disposed on the substrate 10 prepared in the above-described manner, as illustrated in FIGS. 6A and 6B. The semiconductor element 20 is a semiconductor chip, for example. The semiconductor element 20 includes the grouped pads 22, which are individually provided at positions corresponding to the grouped pads 12a in the region 10aa of the substrate 10. For example, before the semiconductor element 20 is mounted on the substrate 10, the bumps (solder balls) 23 are formed individually on the grouped pads 22 of the semiconductor element 20.

The protrusions 70 are solder balls, for example. Each of the solder balls to be rendered as the protrusions 70 has such a size that, when the solder ball is installed as the protrusion 70 on the substrate 10, the protrusion 70 does not come in contact with the heat sink 30 to be disposed in a manner described below. This allows for a reduction in production costs compared to the case of using the protrusions 70 each having such a size that the protrusion 70 comes in contact with the heat sink 30. The solder balls to be rendered as the protrusions 70 may be made using various materials of different composition. For example, the solder balls may be made of materials containing tin (Sn), or containing primarily Sn with silver (Ag), Cu, indium (In), bismuth (Bi), antimony (Sb), zinc (Zn) or the like.

Mounting of the semiconductor element 20 and the grouped protrusions 70 on the substrate 10 is performed in the following procedure, for example. First, a pre-soldering layer (not illustrated) is formed on each of the grouped pads 12a and 12b of the substrate 10 by, for example, solder paste screen printing. Then, the grouped bumps 23 on the semiconductor element 20 are attached to the grouped pads 12a with the pre-soldering layer formed thereon. In addition, the solder balls to be rendered as the protrusions 70, each having a desired size and made of desired materials are individually attached to the groped pads 12b with the pre-soldering layer formed thereon. Either of the attachment of the semiconductor element 20 (the grouped bumps 23 provided thereon) to the substrate 10 and the attachment of the solder balls to be rendered as the protrusions 70 may be performed first, or these attachment processes may be performed simultaneously.

After the grouped bumps 23 of the semiconductor element 20 and the grouped solder balls to be rendered as the protrusions 70 are attached to the substrate 10 in the above-described manner, the bumps 23 and the solder balls undergo mass reflow at desired temperature. By the mass reflow process, the grouped bumps 23 and the grouped solder balls are melted by heat and then solidified by subsequent cooling. Herewith, the semiconductor element 20 and the substrate 10 are mechanically and electrically connected to each other when their grouped bumps 23 and pads 12a are joined together, and the grouped solder balls are joined to the grouped pads 12b on the substrate 10 to thereby form the grouped protrusions 70.

The structure where the semiconductor element 20 and the grouped protrusions 70 are mounted on the substrate 10, as illustrated in FIGS. 6A and 6B, is achieved, for example, by the above-described procedure. In the case of mounting the semiconductor element 20 and the grouped protrusions 70 on the substrate 10 using the mass reflow process described above, the grouped bumps 23 and the grouped solder balls to be rendered as the protrusions 70 are made of materials with the same or similar melting points.

The structure illustrated in FIGS. 6A and 6B is also achieved by a procedure in which, first, the grouped bumps 23 of the semiconductor element 20 are attached to the substrate 10 and undergo reflow and, then, the grouped solder balls to be rendered as the protrusions 70 are attached to the substrate 10 and undergo reflow. Alternatively, the structure of FIGS. 6A and 6B is achieved by a procedure in which, first, the grouped solder balls to be rendered as the protrusions 70 are attached to the substrate 130 and undergo reflow and, then, the grouped bumps 23 of the semiconductor element 20 are attached to the substrate 10 and undergo reflow. Further, the structure of FIGS. 6A and 6B is also achieved by the following procedure. First, a group of solder balls to be rendered as the bumps 23 of the semiconductor element 20 and the grouped solder balls to be rendered as the protrusions 70 are attached to the substrate 10. Subsequently, the semiconductor element 20 is positioned on the grouped solder balls to be rendered as the bumps 23, and a mass reflow process is then performed. This allows the semiconductor element 20 to be mounted on the substrate 10 via the grouped bumps 23, and also allows the grouped protrusions 70 to be mounted thereon. Any of the above-described procedures may be adopted to obtain the structure illustrated in FIGS. 6A and 6B instead.

Figure 7A:
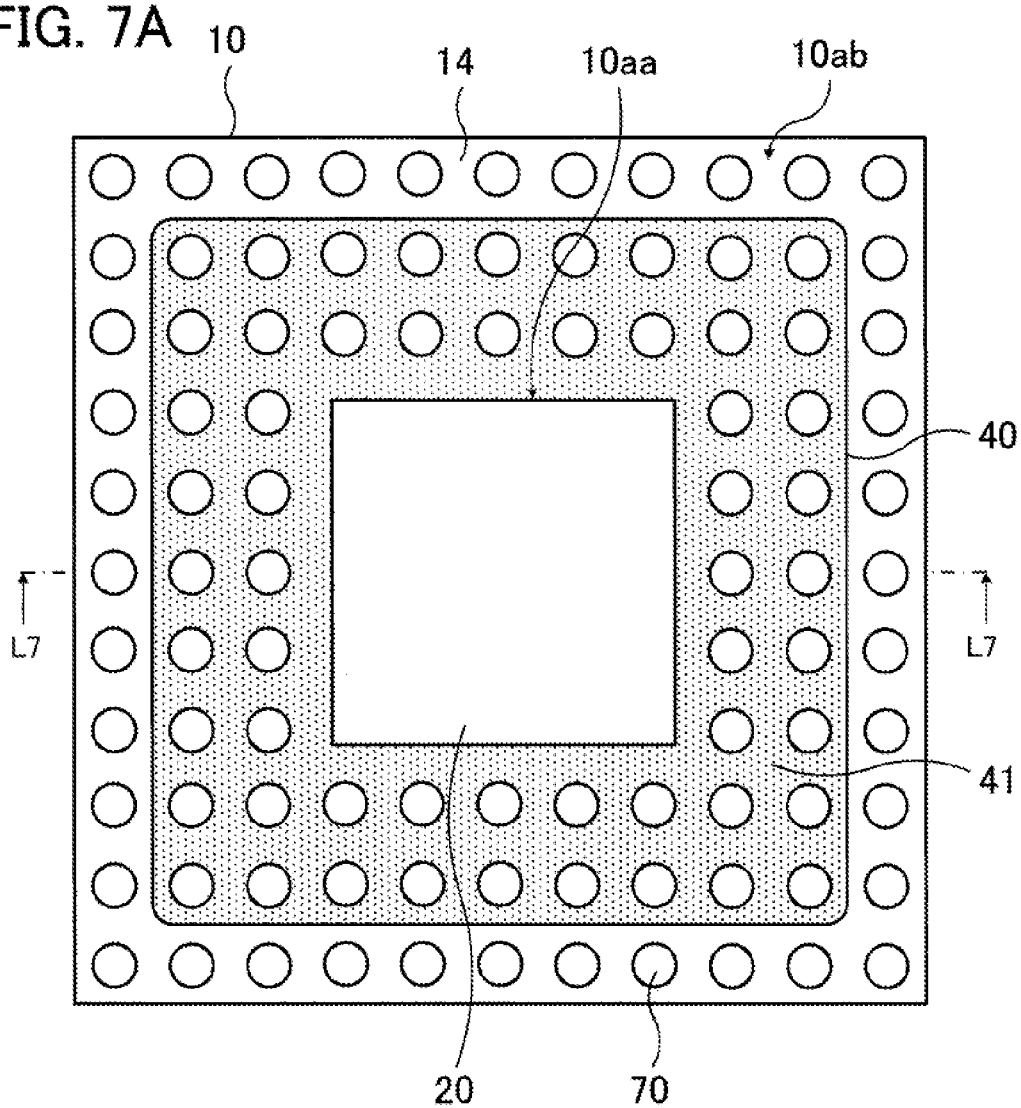
FIGS. 7A and 7B illustrate an example of an underfill resin disposing step according to the first embodiment.
Figure 7B:
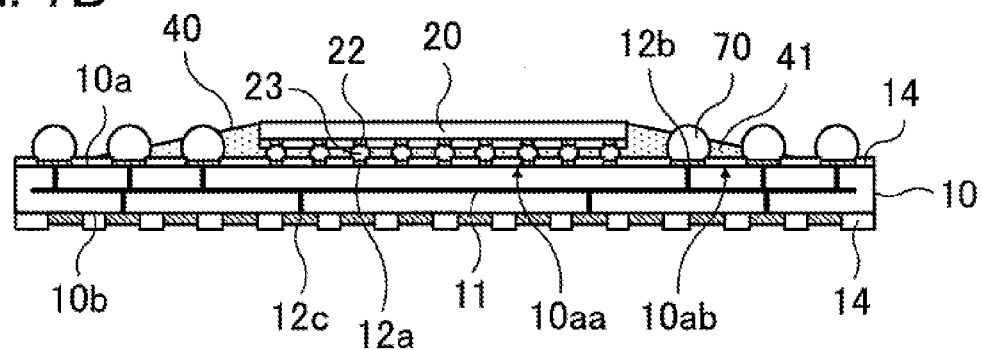

FIGS. 7A and 7B illustrate an example of a step of disposing the underfill resin according to the first embodiment. FIG. 7A is a schematic plan view of a main part associated with the underfill resin disposing step. FIG. 7B is a schematic cross-sectional view of the main part associated with the disposing step, specifically a schematic cross-sectional view of FIG. 7A along line L7-L7. After the semiconductor element 20 and the grouped protrusions 70 are mounted on the substrate 10, the underfill resin 40 is disposed on the substrate 10, as illustrated in FIGS. 7A and 7B.

The underfill resin 40 is made of a resin material, for example, an epoxy resin. The resin material may include an insulating filler, such as silica and alumina. The resin material of the underfill resin 40 is characterized by having fluidity when being supplied on top of the substrate 10 and then being cured by heat or ultraviolet light.

In order to dispose the underfill resin 40, first, a desired resin material is supplied to a marginal part of the semiconductor element 20 mounted on the substrate 10 via the grouped bumps 23, using a supply device such as a dispenser. The resin material supplied to the marginal part of the semiconductor element 20 fills the gap between the substrate 10 and the semiconductor element 20 due to capillary action and also extends outward from the semiconductor element 20. The resin material after filling the gap between the substrate 10 and the semiconductor element 20 and then extending outward from the semiconductor element 20 is, for example, cured by heat or ultraviolet light. Note that in the case of curing the resin material by heat, an appropriate heating temperature, or appropriate types of the resin material and the solder used for the grouped protrusions 70 and bumps 23 are selected so that the application of heat may not melt the solder and cause undesirable outflow and alterations in terms of performance and/or quality. By supplying and then curing the resin material in the above-described manner, the underfill resin 40 with the fillet 41 extending outward from the semiconductor element 20 is disposed, as illustrated in FIGS. 7A and 7B.

As illustrated in FIG. 7B, the fillet 41 extends outward from the lateral side of the semiconductor element 20, with its thickness gradually reduced. Each of the grouped protrusions 70 on the substrate 10 is configured, when the protrusion 70 is disposed (in the step of FIGS. 6A and 6B), to have such a size that at least part of the protrusion 70 may be exposed from the fillet 41 extending outward from the semiconductor element 20. Alternatively, in the step of disposing the underfill resin 40 (FIGS. 7A and 7B), the thickness and breadth of the fillet 41, the viscosity of the resin material, and the like are adjusted so that at least part of each of the protrusions 70 is exposed from the fillet 41. The reason why at least part of the individual protrusions 70 on the substrate 10 is exposed from the fillet 41 is to bring the adhesive 60 (to be disposed in a manner described below) into contact with the grouped protrusions 70 (or, specifically, to bond the adhesive 60 to the grouped protrusions 70).

Figure 8A:
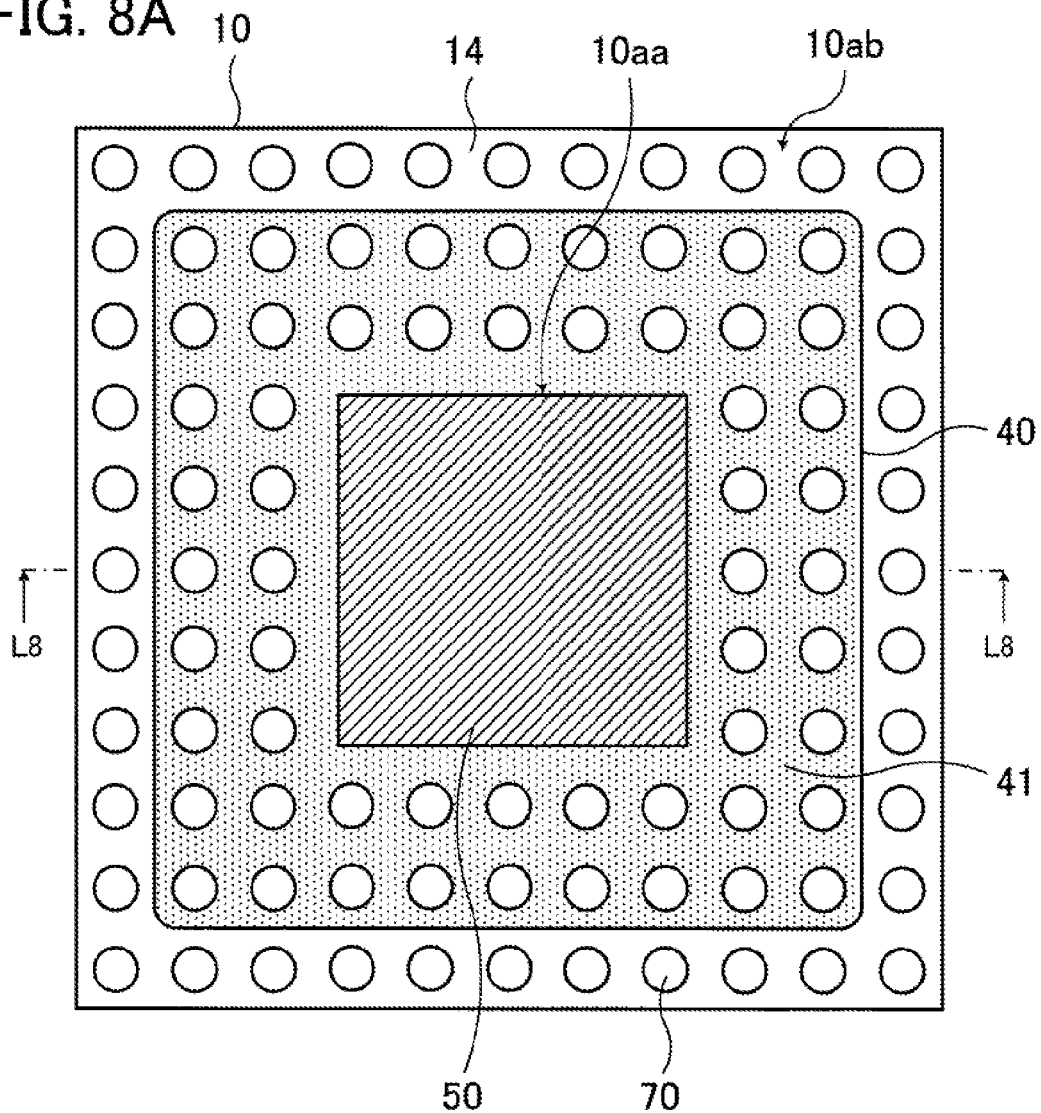
FIGS. 8A and 8B illustrate an example of a thermally conducting material disposing step according to the first embodiment.
Figure 8B:
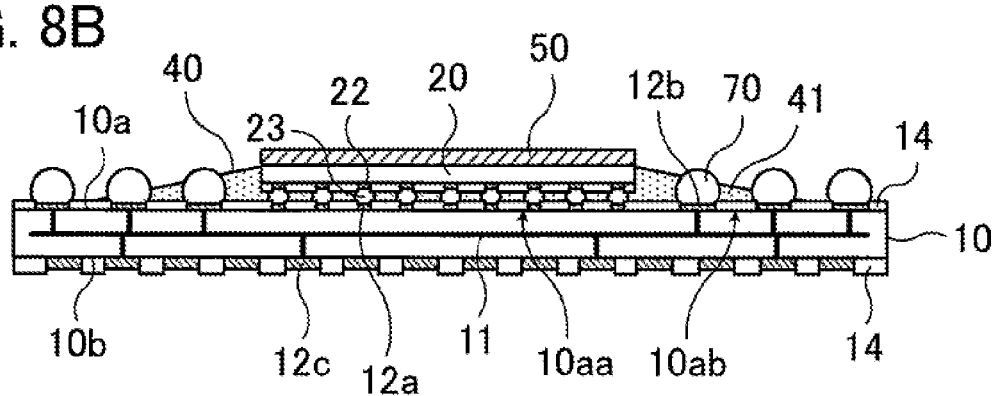

FIGS. 8A and 8B illustrate an example of a thermally conducting material disposing step according to the first embodiment. FIG. 8A is a schematic plan view of a main part associated with the thermally conducting material disposing step. FIG. 8B is a schematic cross-sectional view of the main part associated with the thermally conducting material disposing step, specifically a schematic cross-sectional view of FIG. 8A along line L8-L8. After the underfill resin 40 is provided, the thermally conducting material 50 is disposed on the semiconductor element 20, as illustrated in FIGS. 8A and 8B.

A material with thermal conductivity is used as the thermally conducting material 50. The thermally conducting material 50 is, for example, a silicone sheet or paste, or a silicone sheet or paste containing a thermally conductive filler, such as metal and ceramic. Alternatively, the thermally conducting material 50 may be solder, or an electrically conductive paste in which a resin material contains solder, Ag, or the like. The thermally conducting material 50 is provided on the upper surface (rear surface) of the semiconductor element 20 mounted on the substrate 10 by a technique, such as bonding, mounting, and coating, according to the type of the thermally conducting material 50, and then cured by heat or ultraviolet light if needed. In the case of curing the thermally conducting material 50 by heat, an appropriate heating temperature, or appropriate types of the thermally conducting material 50 and the solder used for the grouped protrusions 70 and bumps 23 are selected so that the application of heat may not melt the solder and cause undesirable outflow and alterations in terms of performance and/or quality.

Note that, the disposition of the underfill resin 40 illustrated in FIGS. 7A and 7B above may be performed after the thermally conducting material 50 is disposed. For example, the thermally conducting material 50 and the underfill resin 40 may individually be disposed in the stated order if the supply and curing of the resin material of the underfill resin 40 does not cause a change in the characteristics and shape of the thermally conducting material 50.

Figure 9A:
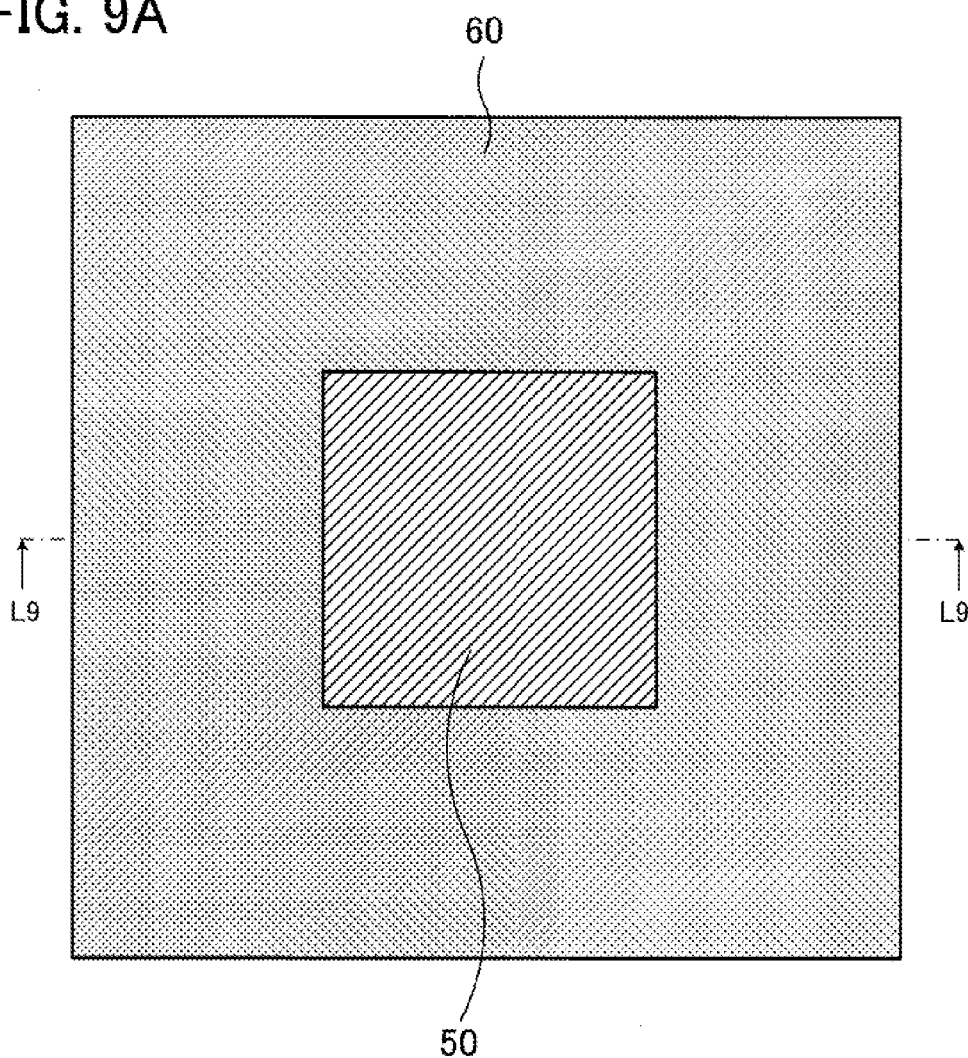
FIGS. 9A and 9B illustrate an example of an adhesive disposing step according to the first embodiment.
Figure 9B:
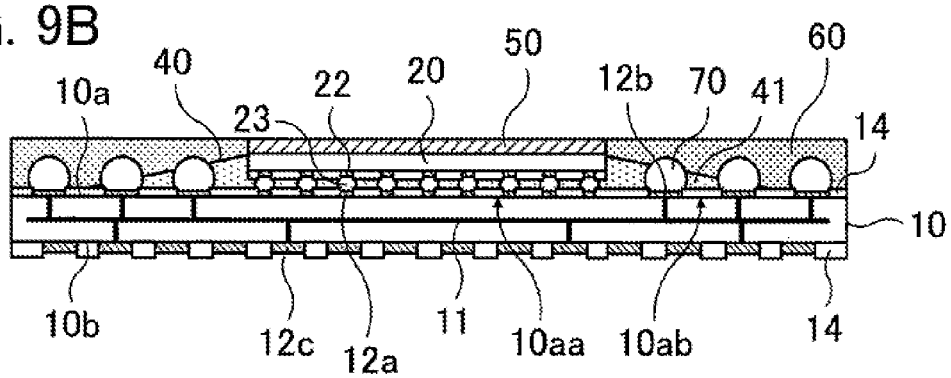

FIGS. 9A and 9B illustrate an example of an adhesive disposing step according to the first embodiment. FIG. 9A is a schematic plan view of a main part associated with the adhesive disposing step. FIG. 9B is a schematic cross-sectional view of the main part associated with the disposing step, specifically a schematic cross-sectional view of FIG. 9A along line L9-L9. After the underfill resin 40 and the thermally conducting material 50 are provided, the adhesive 60 is disposed in such a manner as to cover each of the grouped protrusions 70 provided on the substrate 10, with at least part thereof being exposed, as illustrated in FIGS. 9A and 9B.

The adhesive 60 is, for example, an electrically conductive adhesive. The adhesive 60 preferably has thermal conductivity. For example, silicone containing a thermally conductive filler, such as metal, may be used as the adhesive 60. The adhesive 60 is supplied onto the substrate 10 with the underfill resin 40 and the thermally conducting material 50 formed thereon, and disposed to cover the grouped protrusions 70.

FIGS. 9A and 9B depict the case where the adhesive 60 is disposed in such a manner that the upper surface of the thermally conducting material 50 is exposed; however, the adhesive 60 may be disposed, covering the upper surface of the thermally conducting material 50 if the adhesive 60 has thermal conductivity.

Note that in the case of not using the heat sink 30 (to be formed in a manner described below) as an electromagnetic shield, an insulating adhesive is supplied, as the adhesive 60, onto the substrate 10 with the underfill resin 40 and the thermally conducting material 50 formed thereon, and disposed to cover the grouped protrusions 70.

Figure 10A:
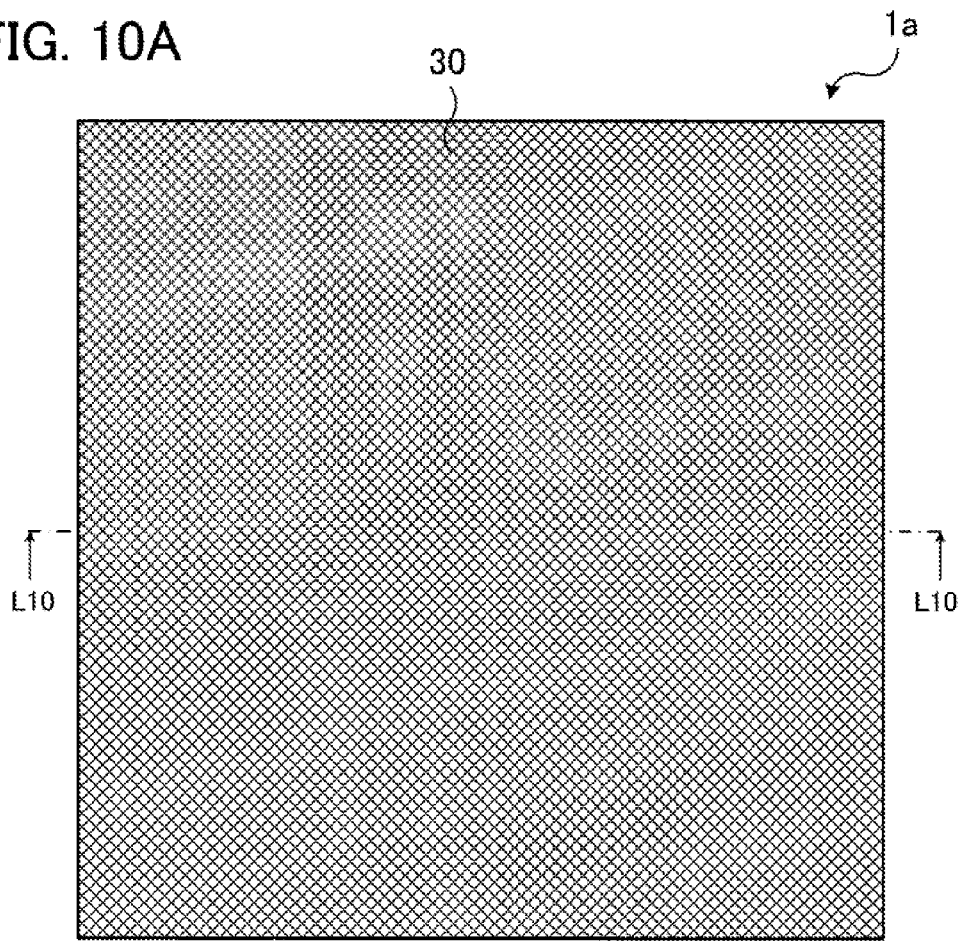
FIGS. 10A and 10B illustrate an example of a heat sink disposing step according to the first embodiment.
Figure 10B:
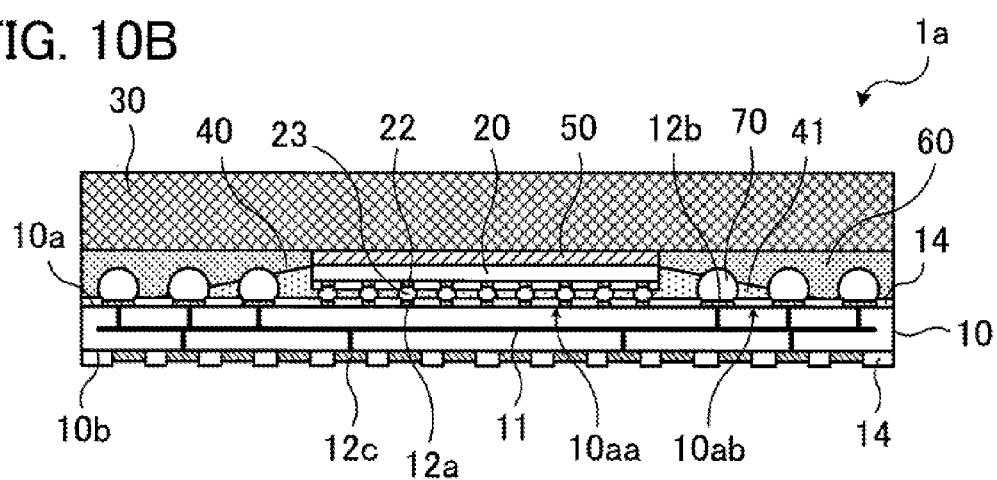

FIGS. 10A and 10B illustrate an example of a heat sink disposing step according to the first embodiment. FIG. 10A is a schematic plan view of a main part associated with the heat sink disposing step. FIG. 10B is a schematic cross-sectional view of the main part associated with the disposing step, specifically a schematic cross-sectional view of FIG. 10A along line L10-L10. After the adhesive 60 is provided, the heat sink 30 is disposed on the adhesive 60 and the thermally conducting material 50, as illustrated in FIGS. 10A and 10B.

A material with thermal conductivity is, for example, used as the heat sink 30. In the case of using the heat sink 30 as an electromagnetic shield, an electrically conductive material is used as the heat sink 30. The heat sink 30 is made, for example, of metal with thermal and electrical conductivity, such as Cu and Al.

The heat sink 30 is disposed to oppose the surface of the substrate 10, on which the semiconductor element 20 and the grouped protrusions 70 are mounted, and then pressed at a pressure to be thereby bonded by the adhesive 60. The height of the heat sink 30 from the substrate 10 is adjusted by the amount of the pressing force. When the pressing force is being applied to the heat sink 30 to adjust it to a desired height from the substrate 10, the thermally conducting material 50 may be compressed and decrease in thickness. The adhesive 60 is cured by heat or ultraviolet light. In the case of curing the adhesive 60 by heat, an appropriate heating temperature, or appropriate types of the adhesive 60 and the solder used for the grouped protrusions 70 and bumps 23 are selected so that the application of heat may not melt the solder and cause undesirable outflow and alterations in terms of performance and/or quality.

The provision of the heat sink 30 on the adhesive 60 and the thermally conducting material 50 allows the semiconductor element 20 and the heat sink 30 to be thermally connected to each other via the thermally conducting material 50 and the adhesive 60. In this example, the heat sink 30 is disposed away from the tip ends of the grouped protrusions 70 (i.e., the adhesive 60 intervenes between the heat sink 30 and the tip ends of the grouped protrusions 70).

The heat sink 30 is formed in a plate-like shape with both two surfaces (i.e., a surface opposing the substrate 10 and a surface opposite to it) being flat. Alternatively, the heat sink 30 may be formed in a shape such that the surface opposing the substrate 10 is flat and the opposite surface has, for example, a plurality of pin, plate, or corrugated fins thereon. In this case, a different member with such fins provided thereon may be joined to the plate-like heat sink 30. The heat sink 30 with the surface opposing the substrate 10 being flat is prepared with reduced manufacturing man-hours and cost, compared to one with the surface being not flat. In turn, this curbs growth in man-hours and cost for manufacturing semiconductor devices (including semiconductor devices 1a, 1A, 1B, 1C, 1D, 1E, and 1F described below, in addition to the semiconductor device 1) using the heat sink 30.

In the case of the adhesive 60 being electrically conductive, the heat sink 30 is electrically connected to the substrate 10 through the adhesive 60, the grouped protrusions 70 at least part of each of which is in contact with the adhesive 60, and the grouped pads 12b on which the grouped protrusions 70 are individually mounted. The grouped pads 12b of the substrate 10 are electrically connected to the ground wiring 11, which allows the heat sink 30 to be grounded.

A semiconductor device 1a is obtained after the manufacturing process has completed the step of bonding the heat sink 30 in the above-described manner. The semiconductor device 1a may be used as a land grid array (LGA) semiconductor device.

Note that the manufacturing order of the step of FIGS. 10A and 10B (the disposition of the heat sink 30 on the thermally conducting material 50) and the step of FIGS. 9A and 9B (the disposition of the adhesive 60) is interchangeable. That is, the heat sink 30 may be disposed on the thermally conducting material 50 prior to the adhesive 60 being disposed between the heat sink 30 and the substrate 10.

Figure 11A:
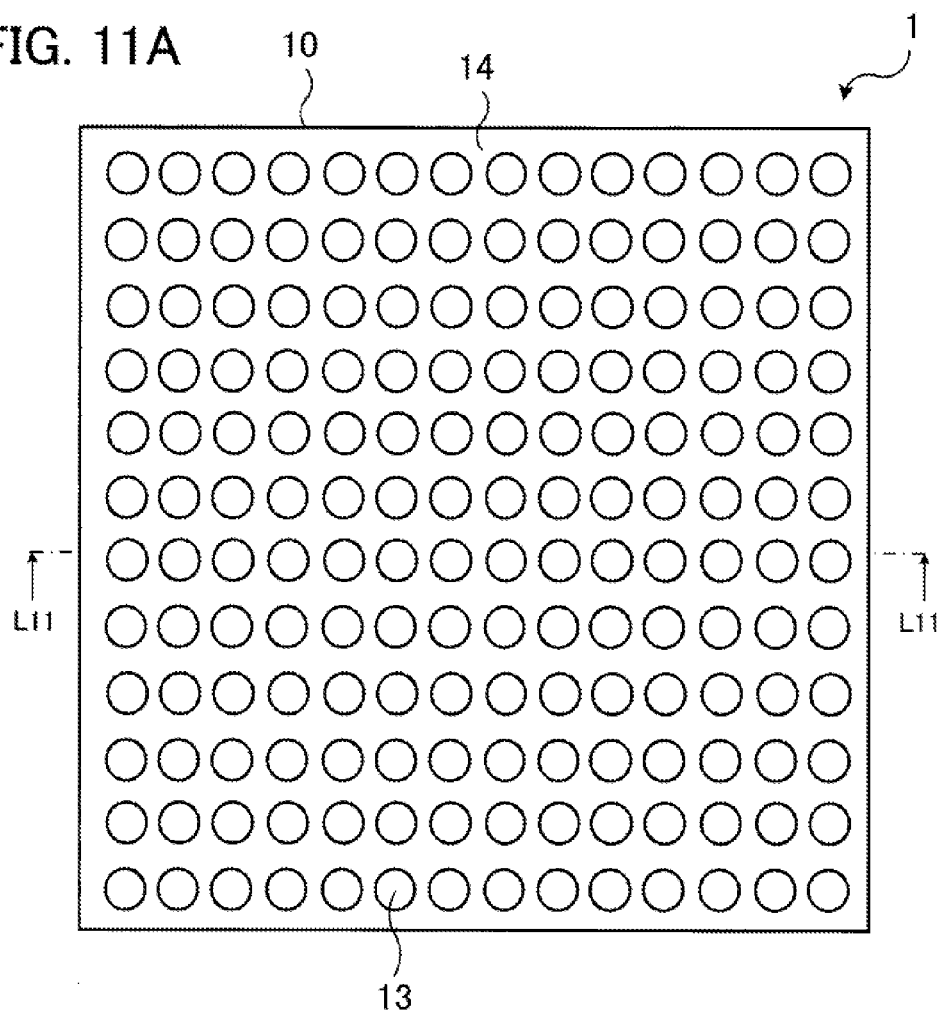
FIGS. 11A and 11B illustrate an example of an electrode disposing step according to the first embodiment.
Figure 11B:
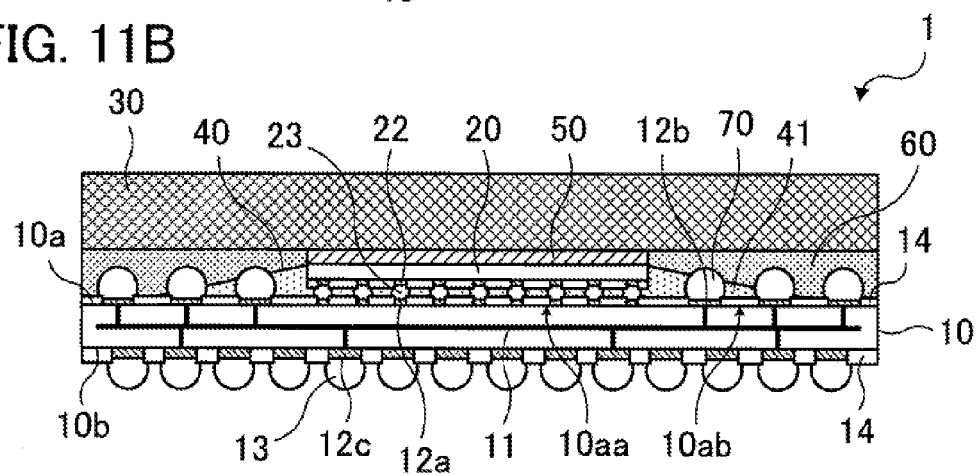

FIGS. 11A and 11B illustrate an example of an electrode disposing step according to the first embodiment. FIG. 11A is a schematic plan view of a main part associated with the electrode disposing step. FIG. 11B is a schematic cross-sectional view of the main part associated with the disposing step, specifically a schematic cross-sectional view of FIG. 11A along line L11-L11. After the manufacturing process has completed the step of bonding the heat sink 30, the terminals 13 are individually disposed on the grouped pads 12c on the rear surface 10b of the substrate 10, as illustrate in FIGS. 11A and 11B. Solder, for example, is used to form the terminals 13. For example, solder balls are individually placed on the grouped pads 12c on the rear surface 10b of the substrate 10 and then undergo reflow, to thereby form the terminals 13. Herewith, the ball grid array (BGA) semiconductor device 1, as illustrated in FIGS. 11A and 11B as well as FIGS. 1 and 2 above, is obtained.

(b) Second Embodiment

Figure 12:
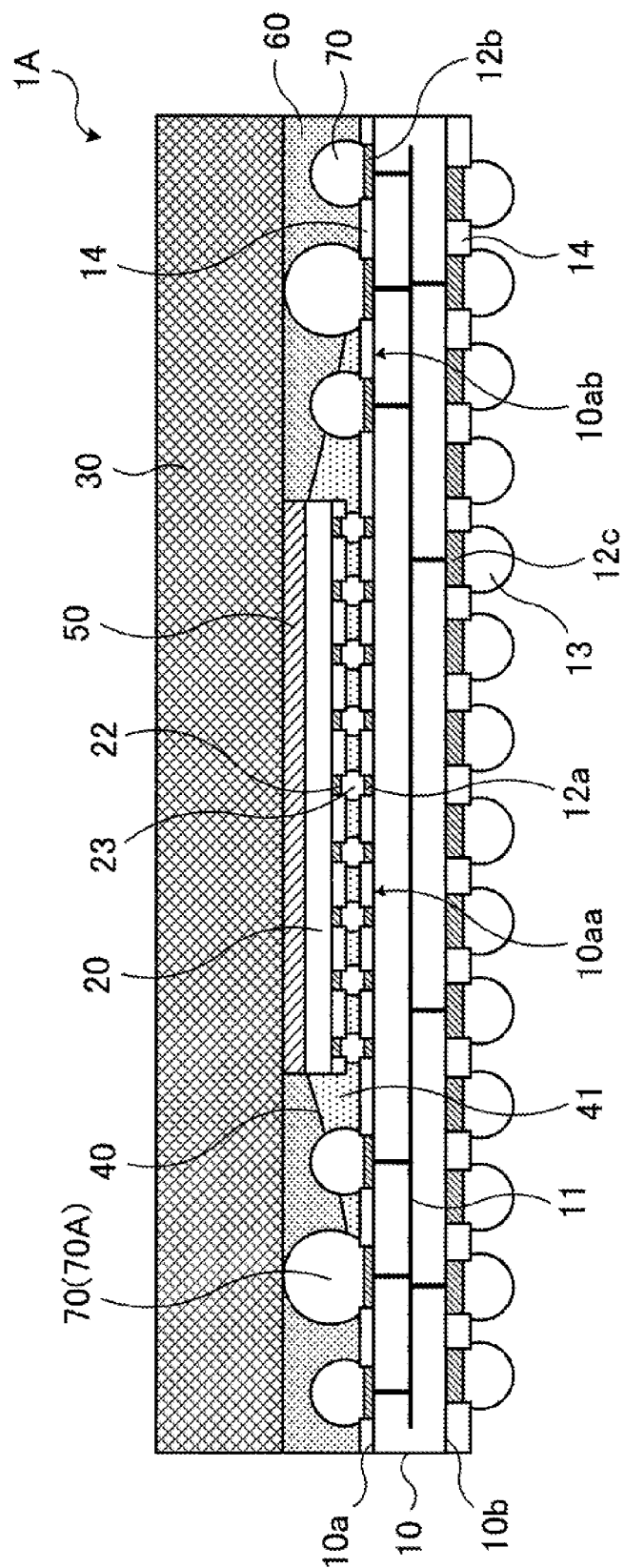
FIG. 12 is a first example of a configuration of a semiconductor device according to a second embodiment.
Figure 13:
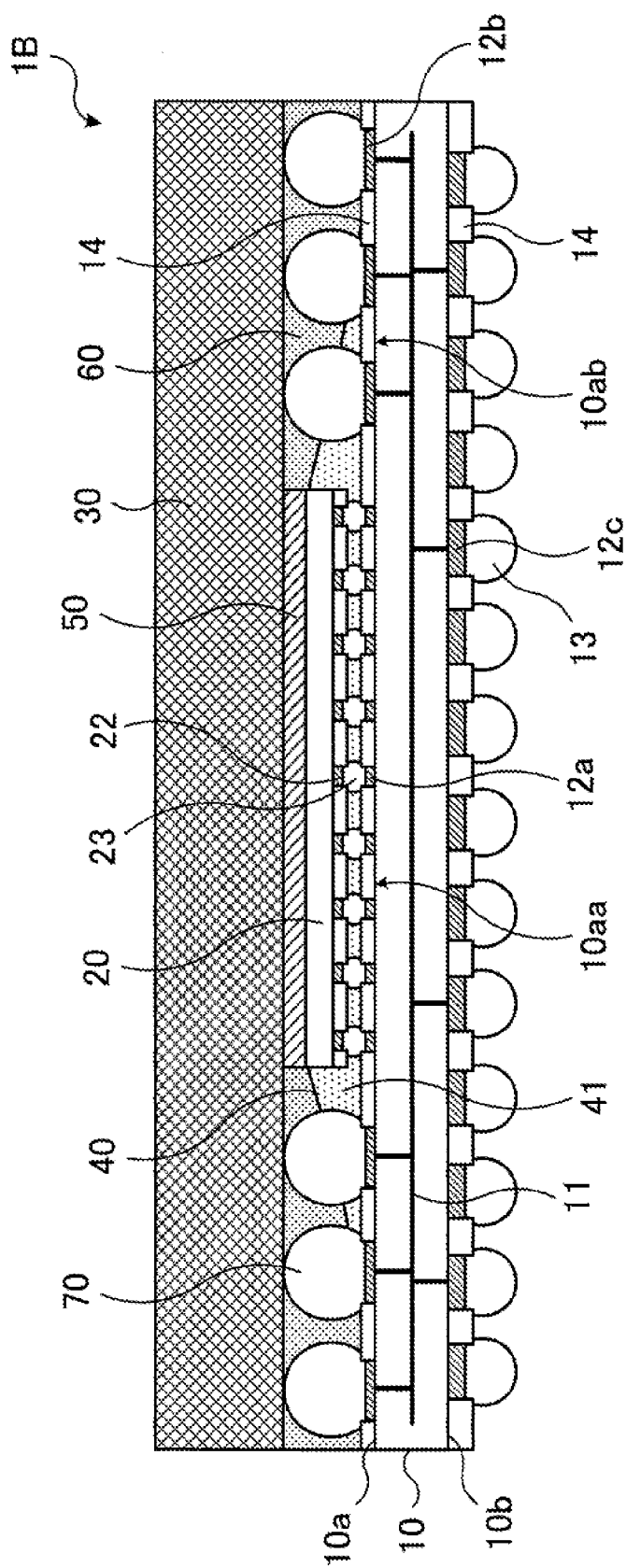
FIG. 13 is a second example of the configuration of the semiconductor device according to the second embodiment.

FIGS. 12 and 13 illustrate examples of a configuration of a semiconductor device according to a second embodiment. Each of FIGS. 12 and 13 is a schematic cross section of a main part of the semiconductor device exemplified in the second embodiment. A semiconductor device 1A illustrated in FIG. 12 differs from the semiconductor device 1 of the first embodiment above in which one or more protrusions 70A (a plurality of protrusions 70A are depicted in FIG. 12 as an example) amongst the grouped protrusions 70 individually disposed on the grouped pads 12b on the substrate 10 are in contact with the heat sink 30. On the other hand, a semiconductor device 1B illustrated in FIG. 13 differs from the semiconductor device 1 of the first embodiment in which all the grouped protrusions 70 individually disposed on the grouped pads 12b of the substrate 10 are in contact with the heat sink 30.

The height of the heat sink 30 from the substrate 10 is adjusted during the manufacturing process by means of, in the case of the semiconductor device 1A, some (the one or more protrusions 70A) of the grouped protrusions 70, in contact with the heat sink 30 and, in the case of the semiconductor 1B, all the grouped protrusions 70 in contact with the heat sink 30. In the case of adjusting the height of the heat sink 30 from the substrate 10 by the amount of the pressing force applied to the heat sink 30 in the step of disposing the heat sink 30 illustrated in FIGS. 10A and 10B above, the height adjustment becomes more difficult with the adhesive 60 and the thermally conducting material 50 being softer. In such a case, as illustrated in FIGS. 12 and 13, some (the one or more protrusions 70A) or all of the grouped protrusions 70 on the substrate 10 are formed to each have a size according to a value set for the height of the heat sink 30 from the substrate 10 (hereinafter simply referred to as the "height set value"). These grouped protrusions 70 are obtained for example by forming, in the step of FIGS. 6A and 6B above, some or all of the solder balls to be rendered as the protrusions 70, each having a size based on the height set value.

Subsequently, in the step of disposing the heat sink 30 (FIGS. 10A and 10B), the pressing force is applied to the heat sink 30 in such a manner that the heat sink 30 abuts on some or all of the grouped protrusions 70 each having the size according to the height set value. This enables the heat sink 30 to be disposed at a desired height from the substrate 10. Some or all of the grouped protrusions 70 each having the size according to the height set value serve as so-called stand-off members for adjusting the height of the heat sink 30 from the substrate 10 at the desired height.

This method of adjusting the height of the heat sink 30 by means of some or all of the grouped protrusions 70 provides, among different sets of the same semiconductor device 1A or 1B, the thermally conducting material 50 of uniform or nearly uniform thickness, intervening between the heat sink 30 and the semiconductor element 20. This leads to reduced variation in the thickness of the thermally conducting material 50, which in turn reduces, among the different sets of the same semiconductor device 1A or 1B, variation in thermal conductivity between the semiconductor element 20 and the heat sink 30. Further, because some or all of the grouped protrusions 70 and the heat sink 30 are directly in contact with each other without the adhesive 60 intervening therebetween, it may be considered to make the grouped protrusions 70 and the adhesive 60 electrically conductive (i.e., to use the heat sink 30 as an electromagnetic shield). This facilitates a reduction in the resistance between the heat sink 30 and the substrate 10.

(c) Third Embodiment

Figure 14:
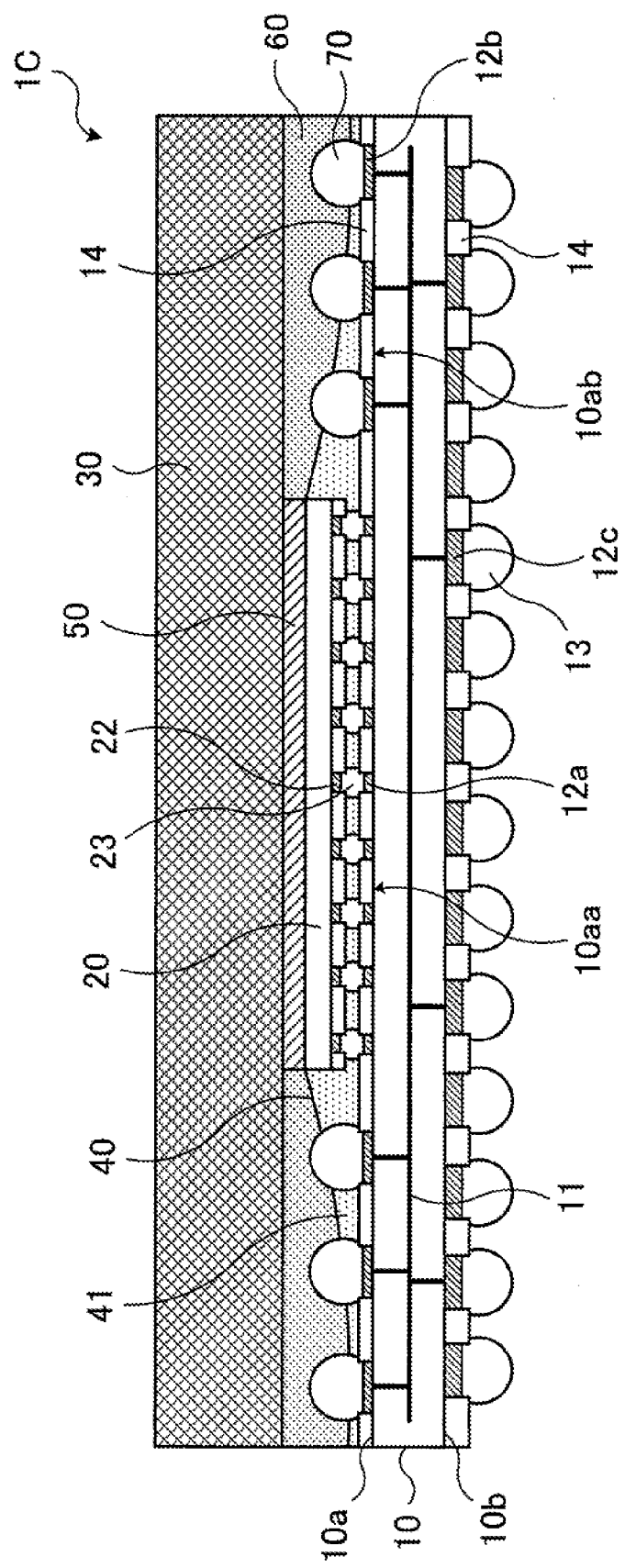
FIG. 14 illustrates an example of a configuration of a semiconductor device according to a third embodiment.

FIG. 14 illustrates an example of a configuration of a semiconductor device according to a third embodiment. FIG. 14 is a schematic cross section of a main part of the semiconductor device exemplified in the third embodiment. A semiconductor device 1C illustrated in FIG. 14 differs from the semiconductor device 1 of the first embodiment above in which the fillet 41 of the underfill resin 40 extends to the edges of the substrate 10. Depending on the viscosity of a resin material used for the underfill resin 40 and the planer sizes of the substrate 10 and the semiconductor element 20, the fillet 41 may extend to the edges of the substrate 10, as illustrated in FIG. 14. In the semiconductor device 1C, the grouped protrusions 70 are provided in such a manner that at least part of each of the protrusions 70 is exposed from the fillet 41 extending to the edges of the substrate 10.

Also in the case where the fillet 41 extends to the edges of the substrate 10, as in the case of the semiconductor device 1C, the grouped protrusions 70 are provided over a region extending from the vicinity of the semiconductor element 20 to the vicinity of the edges of the substrate 10. According to the semiconductor device 1C, it is possible to provide a definite number of grouped protrusions 70 within the extent of the fillet 41 without constraints and bond these grouped protrusions 70 to the adhesive 60, thereby securing the area of contact between them and ensuring the bonding strength therebetween, which in turn reduces separation of the adhesive 60. Further, a definite number of electrical connection paths are established between the heat sink 30 and the substrate 10 via the adhesive 60 and the grouped protrusions 70, which contributes to a reduction in the risk of the electrical connection being cut and a reduction in impedance. Note that, according to the example described in the second embodiment above, some or all of the grouped protrusions 70 of the semiconductor device 1C may individually be formed in such a size as to be in contact with the heat sink 30, so that they act as stand-off members.

(d) Fourth Embodiment

Figure 15:
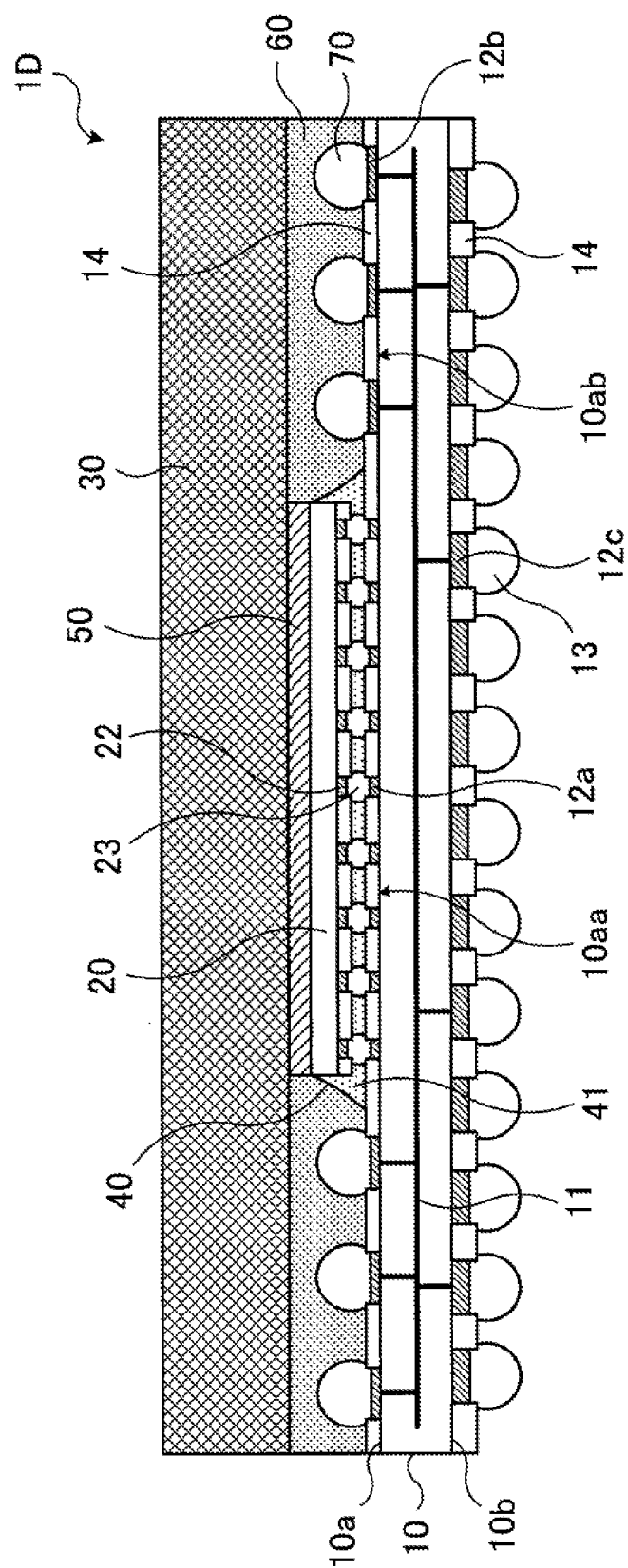
FIG. 15 illustrates an example of a configuration of a semiconductor device according to a fourth embodiment.

FIG. 15 illustrates an example of a configuration of a semiconductor device according to a fourth embodiment. FIG. 15 is a schematic cross section of a main part of the semiconductor device exemplified in the fourth embodiment. A semiconductor device 1D illustrated in FIG. 15 differs from the semiconductor device 1 of the first embodiment above in which the fillet 41 of the underfill resin 40 is formed on the inner side of the disposition region for the grouped protrusions 70 (the region 10ab).

The lateral extent of the underfill resin 40 away from the semiconductor element 20 is limited depending on the viscosity and quantity of the underfill resin 40 supplied to the gap between the substrate 10 and the semiconductor element 20 mounted thereon and the planar sizes of the substrate 10 and the semiconductor element 20. In such a case, the semiconductor device 1D of FIG. 15 is obtained in which the fillet 41 is formed on the inner side of the disposition region for the grouped protrusions 70.

In the semiconductor device 1D, none of the grouped protrusions 70 is in contact with the fillet 41. In the case where each of the protrusions 70 is formed in a ball shape, the semiconductor device 1D obtains not only the anchor effect of the protrusions 70 but also the holding power of the adhesive 60 to hold each of the grouped protrusions 70, thereby reducing separation of the adhesive 60. Note that, according to the example described in the second embodiment above, some or all of the grouped protrusions 70 of the semiconductor device 1D may individually be formed in such a size as to be in contact with the heat sink 30, so that they act as stand-off members.

(e) Fifth Embodiment

Figure 16:
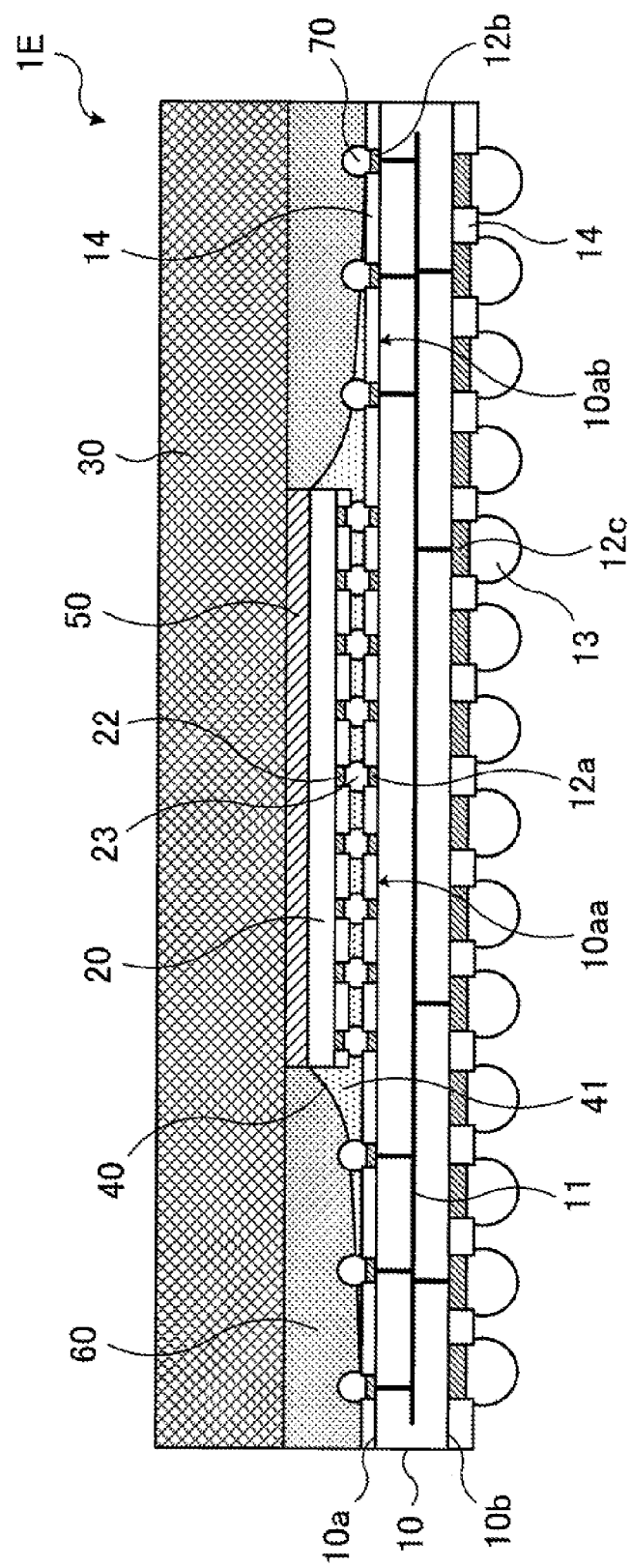
FIG. 16 illustrates an example of a configuration of a semiconductor device according to a fifth embodiment.

FIG. 16 illustrates an example of a configuration of a semiconductor device according to a fifth embodiment. FIG. 16 is a schematic cross section of a main part of the semiconductor device exemplified in the fifth embodiment. A semiconductor device 1E illustrated in FIG. 16 differs from the semiconductor device 1 of the first embodiment above in which each of the grouped protrusions 70 individually disposed on the grouped pads 12b of the substrate 10 has the same, or substantially the same (i.e., almost equivalent), size as each of the grouped bumps 23 of the semiconductor element 20, individually connected to the grouped pads 12a. These grouped protrusions 70 are obtained for example by forming, in the step of FIGS. 6A and 6B above, solder balls to be rendered, after the reflow process, as the protrusions 70 each having the same or substantially the same size as each of the grouped bumps 23 of the semiconductor element 20.

Also in the case of providing the grouped protrusions 70 each having the above-described size, the fillet 41 is adjusted in terms of its thickness and extent over the substrate 10 in such a manner that at least part of each of the protrusions 70 is exposed from the fillet 41 of the underfill resin 40. FIG. 16 depicts, as an example, the fillet 41 not reaching the edges of the substrate 10; however, the fillet 41 on the substrate 10 may extend to the edges thereof according to the example described in the third embodiment above. Alternatively, according to the example described in the fourth embodiment, the fillet 41 may be formed over the substrate 10, on the inner side of the disposition region for the grouped protrusions 70 (the region 10ab). The adhesive 60 is disposed in such a manner as to be in contact with the part of each of the grouped protrusions 70 exposing from the fillet 41. In the case of the adhesive 60 being electrically conductive, the heat sink 30 is electrically connected to the ground wiring 11 of the substrate 10 through the adhesive 60, the grouped protrusions 70, and the grouped pads 12b.

The grouped protrusions 70 each having the same, or substantially the same, size as each of the grouped bumps 23 of the semiconductor element 20, as illustrated in FIG. 16, also reduce separation of the adhesive 60 from the substrate 10 by the above-described anchor effect and holding power. In addition, the use of the grouped protrusions 70 each having the same, or substantially the same, size as each of the grouped bumps 23 of the semiconductor element 20 allows for a reduction in the material and manufacturing costs of the grouped protrusions 70 and, therefore, of the semiconductor device 1E. Further, since each of the protrusions 70 on the substrate 10 is reduced in size, it is possible to narrow the pitch between every two adjacent protrusions 70 so as to form an increased number of the grouped protrusions 70 on the substrate 10. This allows an increase in the area of contact between the adhesive 60 and the grouped protrusions 70, which in turn improves the strength of bonding between them.

(f) Sixth Embodiment

Figure 17:
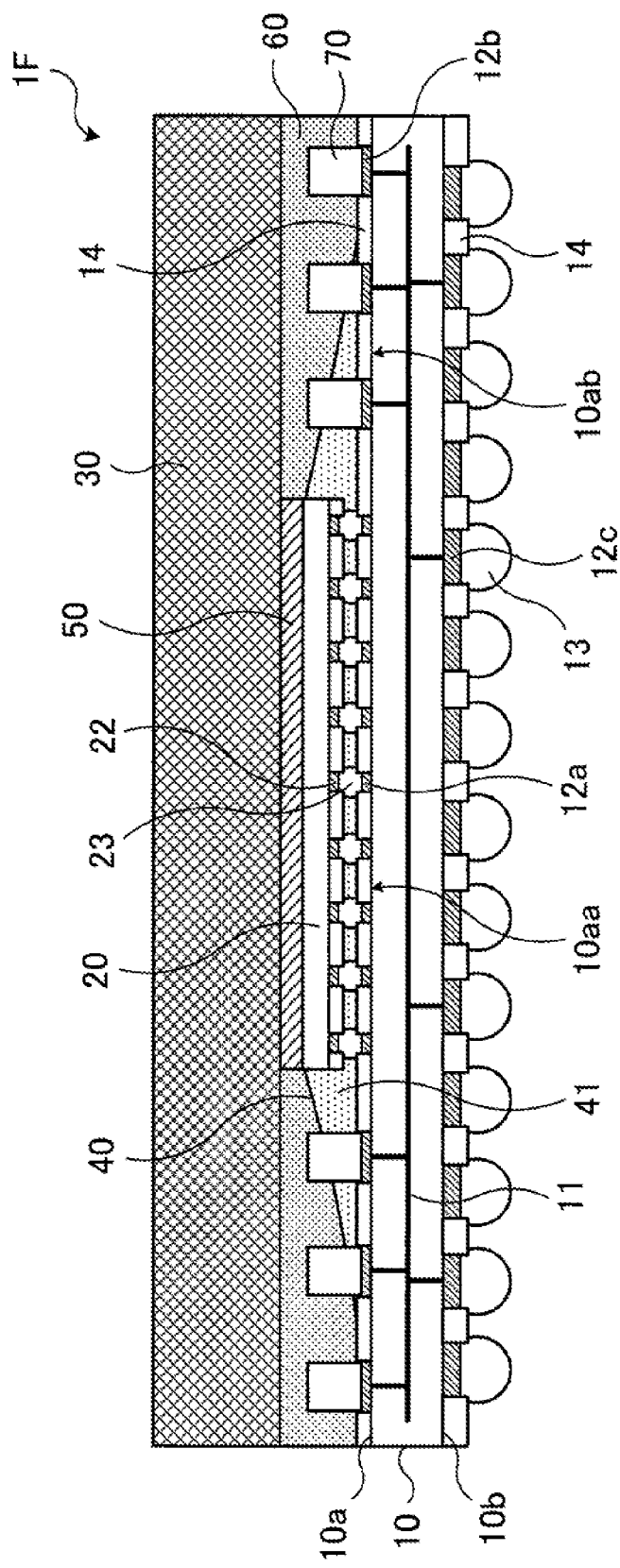
FIG. 17 illustrates an example of a configuration of a semiconductor device according to a sixth embodiment.

FIG. 17 illustrates an example of a configuration of a semiconductor device according to a sixth embodiment. FIG. 17 is a schematic cross section of a main part of the semiconductor device exemplified in the sixth embodiment. A semiconductor device 1F illustrated in FIG. 17 differs from the semiconductor device 1 of the first embodiment above in which each of the grouped protrusions 70 on the substrate 10 has a pillar-like shape.

The grouped protrusions 70 each in the shape of a pillar are obtained for example by mounting, in the step of FIGS. 6A and 6B above, metal pillar members (made, for example, of solder, Cu, Ni, or Au) individually on the grouped pads 12b of the substrate 10, in place of the solder balls. Alternatively, the pillar-shaped protrusions 70 are obtained by plating on the substrate 10 in which a desired metal is selectively deposited on each of the pads 12b. The pillar-shaped protrusions 70 may each take the shape of, for example, a cylinder, a cone, a truncated cone, or an inverted truncated cone. Further, the pillar-shaped protrusions 70 may each take the shape of, for example, a quadratic prism, a square pyramid, a truncated square pyramid, or an inverted truncated square pyramid. Note that FIG. 17 depicts a cross section of the grouped protrusions 70 each formed in the shape of a cylinder or a prism. The grouped protrusions 70 each formed in the shape of a pillar not a ball, as in the case of the semiconductor device 1F, also yield the anchor effect in which the pillar-shaped protrusions 70 act as anchors when enclosed by the adhesive 60, thereby reducing separation of the adhesive 60 from the substrate 10.

Note that, in the semiconductor device 1F, each of the grouped bumps 23 of the semiconductor element 20 may also take the shape of a pillar. In a similar fashion, the above-described semiconductor devices 1, 1a, 1A, 1B, 1C, 1D, and 1E may adopt the pillar-shaped bumps 23 of the semiconductor element 20. In addition, according to the example described in the second embodiment above, some or all of the grouped pillar-shaped protrusions 70 may individually be formed in such a size as to be in contact with the heat sink 30, so that they act as stand-off members. FIG. 17 depicts, as an example, the fillet 41 not reaching the edges of the substrate 10; however, the fillet 41 on the substrate 10 may extend to the edges thereof according to the example described in the third embodiment above. Alternatively, according to the example described in the fourth embodiment, the fillet 41 may be formed over the substrate 10, on the inner side of the disposition region for the grouped pillar-shaped protrusions 70 (the region 10ab). Further, according to the example described in the fifth embodiment above, the grouped pillar-shaped protrusions 70 may individually be formed in the same, or substantially the same, size as that of each of the grouped bumps 23 of the semiconductor element 20.

(g) Seventh Embodiment

Figure 18:
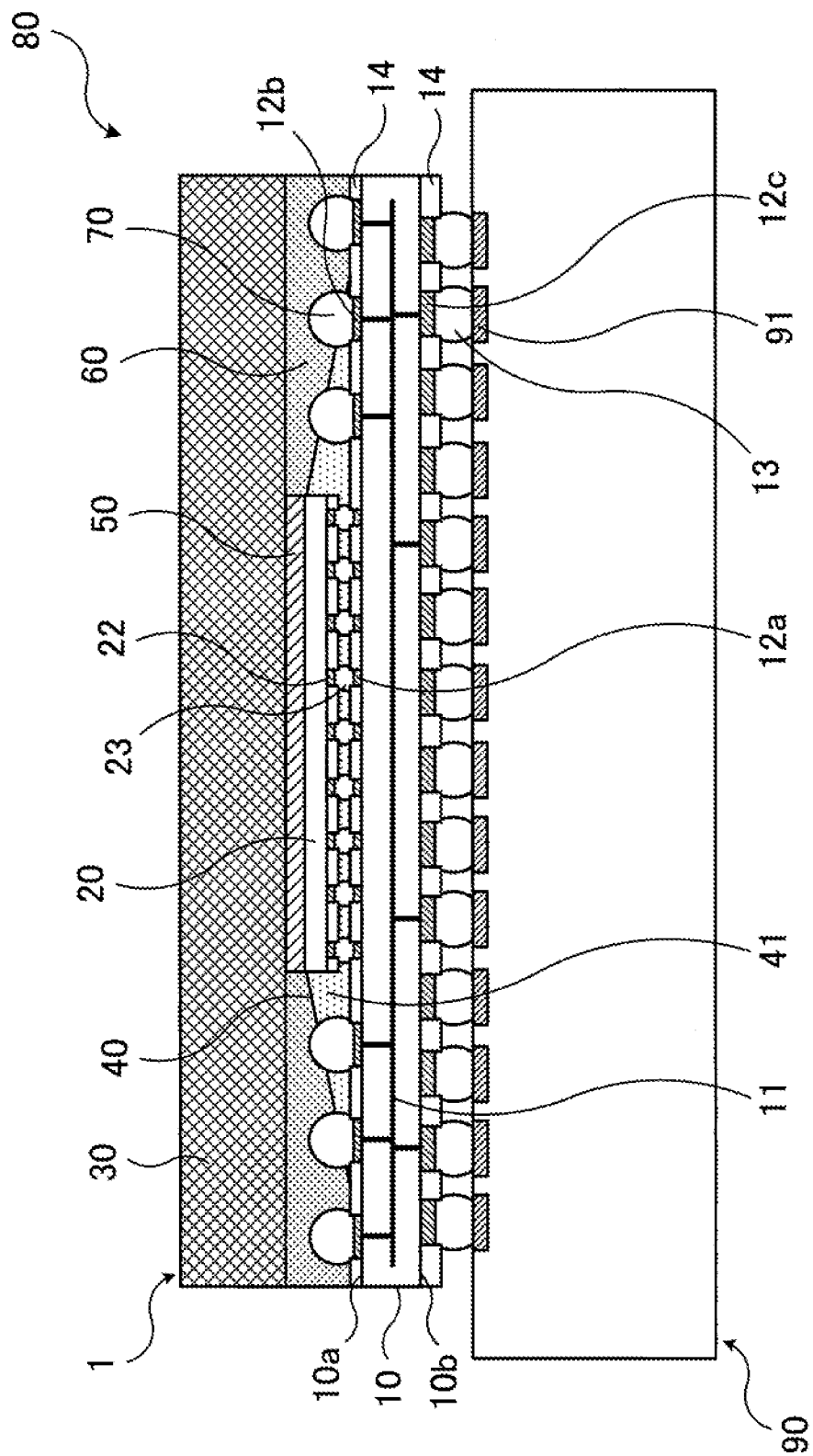
FIG. 18 illustrates an example of a configuration of an electronic apparatus according to a seventh embodiment.

Each of the semiconductor devices 1, 1a, 1A, 1B, 1C, 1D, 1E, and 1F according to the first to sixth embodiments above is ready to be electrically connected to a different electronic part, such as a circuit board. An example of such an embodiment is explained next as a seventh embodiment. FIG. 18 illustrates an example of a configuration of an electronic apparatus according to the seventh embodiment. FIG. 18 is a schematic cross section of a main part of the electronic apparatus exemplified in the seventh embodiment. The seventh embodiment is described by taking, as an example, an electronic apparatus implemented by electrically connecting the semiconductor device 1 of the first embodiment above to a different electronic part. An electronic apparatus 80 illustrated in FIG. 18 includes the semiconductor device 1 having the configuration described in the first embodiment above and an electronic part 90.

The electronic part 90 is, for example, a circuit board or a semiconductor device. As the circuit board, a printed circuit board or a relay board such as a Si interposer may be used. As the semiconductor device, one of the following may be used: a semiconductor chip such as an LSI; a semiconductor package including a semiconductor chip and a package substrate on which the semiconductor chip is mounted; and a pseudo system on a chip (SoC) including a semiconductor chip, a resin layer in which the semiconductor chip is embedded, and a rewiring layer disposed on the resin layer.

The electronic part 90 has a group of terminals (pads) 91 disposed at positions corresponding to the grouped solder ball terminals 13 of the semiconductor device 1. The grouped terminals 91 are electrically connected to a desired circuit element (not illustrated) provided in the electronic part 90 (e.g. a conductor part, such as a wiring system and via holes, or an electronic device, such as a transistor). For example, the electronic part 90 and the semiconductor device 1 are positioned in such a manner that a face of the electronic part 90 on which the grouped terminals 91 are disposed opposes a face of the semiconductor device 1 on which the grouped terminals 13 are disposed. Subsequently, the grouped terminals 91 and 13 are brought in contact with each other. The solder balls of the grouped terminals 13 are melted by heat and then solidified by subsequent cooling. Herewith, the grouped terminals 91 and 13 are joined to each other. By this means, the electronic apparatus 80 is assembled in which the electronic part 90 and the semiconductor device 1 are electrically connected to each other via their grouped terminals 91 and 13.

As for the semiconductor device 1, the provision of the grouped protrusions 70 on the substrate 10 reduces separation of the adhesive 60 from the substrate 10 even when thermal stress arises during the assembly and/or actual use of the electronic apparatus 80. This reduces, in turn, an increase in the thermal resistance between the substrate 10 and the heat sink 30, which keeps the semiconductor element 20 from overheating and resulting damage. In addition, in the case of using the heat sink 30 as an electromagnetic shield (i.e., making the adhesive 60 and the grouped protrusions 70 electrically conductive), it is possible to reduce an increase in the impedance between the substrate 10 and the heat sink 30, thus achieving high electromagnetic shielding performance. The use of the semiconductor device 1 with such favorable features allows the implementation of the electronic apparatus 80 with excellent performance and quality.

Note that the description above uses the semiconductor device 1 as an example; however, an electronic apparatus yielding the same effects described above may be fabricated by electrically connecting any one of the semiconductor devices 1a, 1A, 1B, 1C, 1D, 1E, and 1F and the electronic part 90.

According to one aspect, there is provided a semiconductor device in which protrusions formed on a substrate bonded to a heat sink by an adhesive act as anchors to thereby effectively reduce separation of the adhesive from the substrate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a substrate;
   a semiconductor element mounted on a first surface of the substrate;
   a first pad disposed on the first surface and outside of the semiconductor element in a plan view;
   a first protrusion, which has a ball-like shape, disposed on the first pad;
   a heat sink disposed above the semiconductor element and the first protrusion; the heat sink being disposed away from the first protrusion;
   a second adhesive that includes a first part disposed between the semiconductor element and the first surface, and that includes a second part disposed on the first surface and outside of the semiconductor element in a plan view; and
   a first adhesive disposed between the second part and the heat sink, a part of the first adhesive being located between the first protrusion and the heat sink,
   wherein
   the first protrusion is disposed in the second part of the second adhesive and the first adhesive,
   the second part extends outward from the lateral side of the semiconductor element with a thickness of the second part gradually reduced,
   the first pad, the first protrusion, and the first adhesive are electrically conductive respectively, and
   the first pad is electrically connected to the heat sink through the first protrusion and the first adhesive.

2. The semiconductor device according to claim 1, wherein:
   the heat sink includes a flat surface opposing the first surface.

3. The semiconductor device according to claim 1, further comprising a bump disposed between the semiconductor element and the first surface,
   wherein size of the first protrusion is same as size of the bump.

4. The semiconductor device according to claim 1,
   wherein a part of the first protrusion is in contact with the second part of the second adhesive, and
   another part of the first protrusion is in contact with the first adhesive.

5. The semiconductor device according to claim 1, further comprising:
   a second pad disposed on the first surface and outer than the first pad in a plan view; and
   a second protrusion disposed on the second pad,
   wherein the first adhesive bonds the first protrusion, the second protrusion, and the heat sink.

6. The semiconductor device according to claim 5, wherein:
   the second pad, the second protrusion, and the first adhesive are electrically conductive respectively, and
   the second pad is electrically connected to the heat sink through the second protrusion and the first adhesive.

7. The semiconductor device according to claim 1, further comprising:
   a second pad disposed on the first surface and outer than the first pad in a plan view; and
   a second protrusion disposed on the second pad,
   wherein the first adhesive bonds the first protrusion, the second protrusion, and the heat sink.

8. A method of manufacturing a semiconductor device, the method comprising:
   disposing a semiconductor element on a first surface of a substrate that includes a first pad located outside of the semiconductor element in a plan view;
   disposing a first protrusion, which has a ball-like shape, on the first pad;
   disposing a second adhesive, that includes a first part disposed between the semiconductor element and the first surface, and that includes a second part disposed outside of the semiconductor element in a plan view;
   disposing a first adhesive on the second adhesive and the first protrusion; and
   disposing a heat sink above the semiconductor element, the first protrusion, and the first adhesive
   wherein
   the first protrusion is out of contact with the heat sink after disposing the heat sink,
   a part of the first adhesive is located between the first protrusion and the heat sink after disposing the heat sink,
   the second part is in contact with a part of the first protrusion,
   the second part extends outward from the lateral side of the semiconductor element with a thickness of the second part gradually reduced,
   the first pad, the first protrusion, and the first adhesive are electrically conductive respectively, and
   the first pad is electrically connected to the heat sink through the first protrusion and the first adhesive.

9. The method according to claim 8, further comprising disposing a bump on the substrate before disposing the semiconductor element,
   wherein the bump includes solder,
   the first protrusion includes solder, and
   in disposing the semiconductor element and in disposing the first protrusion, the solder of the bump and the solder of the first protrusion are melted and then solidified.

10. The method according to claim 8, wherein:
    the substrate includes a second pad disposed outer than the first pad in a plan view; and the method further includes:
disposing a second protrusion on the second pad before the disposing the first adhesive.

11. An electronic apparatus comprising:
a substrate;
a semiconductor element disposed on a first surface of the substrate;
a first pad disposed on the first surface and outside of the semiconductor element in a plan view;
a first protrusion, which has a ball-like shape, disposed on the first pad;
a heat sink disposed above the semiconductor element and the first protrusion, the heat sink being disposed away from the first protrusion;
a second adhesive that includes a first part disposed between the semiconductor element and the first surface, and that includes a second part disposed on the first surface and outside of the semiconductor element in a plan view;
a first adhesive disposed between the second part and the heat sink, a part of the first adhesive being located between the first protrusion and the heat sink; and
an electronic part electrically connected to the substrate, wherein
the first protrusion is disposed in the second part of the second adhesive and the first adhesive,
the second part extends outward from the lateral side of the semiconductor element with a thickness of the second part gradually reduced,
the first pad, the first protrusion, and the first adhesive are electrically conductive respectively, and
the first pad is electrically connected to the heat sink through the first protrusion and the first adhesive.

12. The semiconductor device according to claim 1, further comprising:
a second pad disposed on the first surface; and
a second protrusion disposed on the second pad, wherein
the second protrusion is contact with the heat sink.

13. The method according to claim 8, further comprising
before disposing the first adhesive, disposing a second protrusion on a second pad which is disposed on the first surface,
wherein
the second protrusion is contact with the heat sink after disposing the heat sink.

14. The electronic apparatus according to claim 11, further comprising:
a second pad disposed on the first surface; and
a second protrusion disposed on the second pad, wherein
the second protrusion is contact with the heat sink.

15. The semiconductor device according to claim 1, wherein the first protrusion is enclosed by the first adhesive in a plan view.

16. The method according to claim 8, wherein the first protrusion is enclosed by the first adhesive in a plan view.

17. The electronic apparatus according to claim 11, wherein the first protrusion is enclosed by the first adhesive in a plan view.

* * * * *